(12) United States Patent
Nakaoka et al.

(10) Patent No.: US 6,558,977 B2
(45) Date of Patent: May 6, 2003

(54) SEMICONDUCTOR DEVICE AND METHOD FOR FABRICATING THE SAME

(75) Inventors: Yukiko Nakaoka, Nara (JP); Kazuhiko Matsumura, Nara (JP); Hideyuki Kaneko, Hyogo (JP); Koichi Nagao, Kyoto (JP)

(73) Assignee: Matsushita Electric Industrial Co., Ltd. (JP)

( * ) Notice: Subject to any disclaimer, the term of this patent is extended or adjusted under 35 U.S.C. 154(b) by 0 days.

(21) Appl. No.: 10/128,298

(22) Filed: Apr. 24, 2002

(65) Prior Publication Data

US 2002/0115233 A1 Aug. 22, 2002

Related U.S. Application Data

(62) Division of application No. 09/966,093, filed on Oct. 1, 2001.

(30) Foreign Application Priority Data

Dec. 26, 2000 (JP) ........................................ 2000-395965

(51) Int. Cl.$^7$ .................. H01L 21/44; H01L 21/48; H01L 21/50; H01L 23/495
(52) U.S. Cl. .................. 438/107; 438/106; 438/959; 438/978; 438/108; 257/676; 257/777; 257/778
(58) Field of Search .................. 438/107, 106, 438/108, 959, 978; 257/676, 777, 778

(56) References Cited

U.S. PATENT DOCUMENTS

| | | | | |
|---|---|---|---|---|
| 5,045,505 A | * | 9/1991 | Kimura | 438/140 |
| 5,851,845 A | * | 12/1998 | Wood et al. | 438/15 |
| 5,956,605 A | * | 9/1999 | Akram et al. | 438/613 |
| 6,165,815 A | * | 12/2000 | Ball | 438/113 |
| 6,306,680 B1 | * | 10/2001 | Fillion et al. | 438/106 |
| 6,337,225 B1 | * | 1/2002 | Foong et al. | 438/106 |
| 6,365,438 B1 | * | 4/2002 | Ishida et al. | 438/118 |
| 2001/0023979 A1 | * | 9/2001 | Brouvillette et al. | 257/622 |

* cited by examiner

Primary Examiner—Michael S. Lebentritt
Assistant Examiner—Michael K. Luhrs
(74) Attorney, Agent, or Firm—Nixon Peabody LLP; Donald R. Studebaker

(57) ABSTRACT

In a semiconductor device functioning as a three-dimensional device composed of two semiconductor chips bonded to each other, the back surface of the upper semiconductor chip is polished, the entire side surfaces of the upper semiconductor chip are covered with a resin layer, or the center portion of the upper semiconductor chip is formed to be thicker than the peripheral portion thereof. This suppresses the occurrence of a package crack and improves the reliability of the semiconductor device.

4 Claims, 14 Drawing Sheets

SEMICONDUCTOR DEVICE AND METHOD FOR FABRICATING THE SAME

BACKGROUND OF THE INVENTION

The present invention relates to a semiconductor device in which a second semiconductor chip is disposed on and connected to a first semiconductor chip and a method for fabricating the same.

As recent electronic equipment has become smaller in size and higher in processing speed, a wide range of study has been conducted on a three-dimensional device structure composed of two or more types of semiconductor chips stacked in layers. Compared with technology for forming a three-dimensional device, technology for individually packaging two or more types of semiconductor chips has advantages or disadvantages depending on the types of semiconductor elements provided in the semiconductor chips. For example, individual packaging of semiconductor elements formed by a merging process such as a merged memory-logic device complicates the process, resulting in higher cost. To reduce cost, there have been proposed various methods in each of which two types of semiconductor chips having semiconductor elements formed individually by appropriate processes are stacked in layers. Some of such devices are already being commercialized.

A description will be given herein below to a structure of a conventional three-dimensional semiconductor device and a fabrication method therefor. FIG. 17 is a cross-sectional view showing the structure of the conventional three-dimensional device. FIGS. 18A to 18C are cross-sectional views illustrating the process steps for fabricating the conventional three-dimensional device.

As shown in FIG. 17, the conventional three-dimensional device comprises: a first semiconductor chip 110 having a plurality of first internal electrodes 111 and bonding pads 112 each disposed on an upper surface thereof; a second semiconductor chip 120 having a plurality of second internal electrodes 121 disposed on an upper surface thereof; a die pad 131 for carrying the first semiconductor chip 110; and leads 132 for transmitting electric signals between external equipment and respective elements such as transistors within the semiconductor chips 110 and 120.

The second semiconductor chip 120 is mounted on the first semiconductor chip 110 with the second internal electrodes 121 aligned with respect to the first internal electrodes 111. The first and second internal electrodes 111 and 121 are electrically connected to each other via metal bumps 123. A resin 130 is filled in the space between the first and second semiconductor chips 110 and 120 to provide adhesion therebetween, thereby integrating the first and second semiconductor chip 110 and 120 into a single device. The die pad 131 and the leads 132 have been cut off from a single lead frame. The first semiconductor chip 110 has been secured to the die pad 131 by using a conductive paste 133 containing a metal such as Pd or Ag. The bonding pads 112 of the first semiconductor chip 110 and the leads 132 are electrically connected via bonding wires 134. The first semiconductor chip 110, the second semiconductor chip 120, the bonding wires 134, the die pad 131, and the leads 132 are sealed with a sealing resin 135 to be packaged.

A description will be given next to a method for fabricating the conventional semiconductor device.

In the step shown in FIG. 18A, the first and second semiconductor chips 110 and 120 are aligned by the following procedure. First, the first semiconductor chip 110 having the plurality of first internal electrodes 111 on the upper surface thereof is prepared and placed on a mounting jig (not shown). Then, the resin 130 is applied to the upper surface of the first semiconductor chip 110. On the other hand, the second semiconductor chip 120 having the plurality of second internal electrodes 121 on the upper surface thereof and barrier metals 122 over the upper surface is prepared. Then, the metal bumps 123 are formed on the barrier metals 122 of the second semiconductor chip 120. Subsequently, the second internal electrodes 121 (barrier metals 122) are aligned with respect to the first internal electrodes 111 by opposing, from above, the second semiconductor chip 120 to the first semiconductor chip 110 with the lower surface of the second semiconductor chip 120 facing downward.

Next, in the step shown in FIG. 18B, the first and second semiconductor chips 110 and 120 are bonded to each other by the following procedure. First, the second semiconductor chip 120 is heated and pressed from the back surface thereof by using a metal tool 140 so that the first internal electrodes 111 of the first semiconductor chip 110 and the second internal electrodes 121 of the second semiconductor chip 120 are bonded to each other via the metal bumps 123 formed on the second internal electrodes 121 (on the barrier metals 122) of the second semiconductor chip 120. After bonding, the resin 130 filled in the space between the two semiconductor chips 110 and 120 is cured under the irradiation of UV light 141 or by heating.

Next, in the step shown in FIG. 18C, a wire bonding step is performed with respect to the bonded and integrated semiconductor chip. First, a lead frame 137 having the die pad 131 and the leads 132 is prepared. Then, the first semiconductor chip 110 is secured onto the die pad 131 by using the conductive paste 133 containing Pd, Ag, or the like. Subsequently, the bonding pads 112 of the first semiconductor chip 110 and the leads 132 of the lead frame 137 are connected with the bonding wires 134.

Next, in the step shown in FIG. 18D, the wire bonded semiconductor device is packaged by the following procedure. First, the first semiconductor chip 110, the second semiconductor chip 120, the bonding wires 134, the die pad 131, and the leads 132 are sealed with the sealing resin 135. At this time, the lower or outer side surfaces of the leads 132 are uncovered with the sealing resin 135 and exposed such that the exposed portions function as external terminals.

By the foregoing steps, the three-dimensional device composed of the second semiconductor chip 120 mounted on and integrated with the first semiconductor chip 110 is formed.

However, the semiconductor device as the three-dimensional device has the following problems.

Since the second semiconductor chip 120 bonded onto the first semiconductor chip 110 by face-down bonding has been cut out of a wafer by dicing, the corners 145 of the lower surface of the second semiconductor chip 120 that have been ground during dicing remain unchanged. As a result, a stress occurring during the curing of the sealing resin is localized to the corners 145 of the lower surface of the second semiconductor chip 120 so that the overall characteristics of the semiconductor device are more likely to deteriorate.

Even if the semiconductor device is not sealed with a sealing resin, the reliability of connection between the semiconductor chips is more likely to lower under the influence of the warping of the semiconductor chips when the semiconductor device is heated.

SUMMARY OF THE INVENTION

It is therefore an object of the present invention to provide a semiconductor device and a fabrication method therefor which suppress the localization of a stress to the corners of the back surface of the second semiconductor chip bonded to the first semiconductor chip or reduces the warping of the chips.

A first semiconductor device of the present invention comprises: a first semiconductor chip having a first electrode disposed on an upper surface thereof; and a second semiconductor chip having a second electrode disposed on an upper surface thereof, the second semiconductor chip being mounted on the first semiconductor chip with the second electrode being electrically connected to the first electrode, a corner of a lower surface of the second semiconductor chip being blunted by processing.

The arrangement suppresses the localization of the stress to the corner of the lower surface of the second semiconductor chip, suppresses the occurrence of a package crack or the like, and thereby prevents the deterioration of the overall characteristics of the semiconductor device as the three-dimensional device.

The corner of the lower surface of the second semiconductor chip has a curved surface so that the occurrence of the package crack is suppressed more effectively.

Preferably, the curved surface of the corner of the lower surface of the second semiconductor chip has a radius of curvature larger than 1 $\mu$m.

A resin layer is interposed between the first and second semiconductor chips to provide more reliable connection.

A second semiconductor device of the present invention comprises: a first semiconductor chip having a first electrode disposed on an upper surface thereof; a second semiconductor chip having a second electrode disposed on an upper surface thereof, the second semiconductor chip being mounted on the first semiconductor chip with the second electrode being electrically connected to the first electrode; and a resin layer interposed between the first and second semiconductor chips to cover an entire side surface of the second semiconductor chip.

The arrangement reduces the warping of the three-dimensional device and provides reliable connection.

Preferably, a portion of the resin layer interposed between the first and second semiconductor chips and a portion of the resin layer covering the entire side surface of the second semiconductor chip are composed of different resin materials.

Preferably, a quantity of fillers contained in the portion of the resin layer covering the entire side surface of the second semiconductor chip is larger than a quantity of fillers contained in the portion of the resin layer interposed between the first and second semiconductor chips or an average diameter of fillers contained in the portion of the resin layer covering the entire side surface of the second semiconductor chip is larger than an average diameter of fillers contained in the portion of the resin layer interposed between the first and second semiconductor chips.

In any of the foregoing arrangements, the elastic coefficient in the portion of the resin layer covering the entire side surface of the second semiconductor chip increases to enhance the chip protecting function and the thermal expansion coefficient therein approaches that of the semiconductor chip. This enhances the warping preventing function.

An upper surface of the portion of the resin layer covering the entire side surface of the second semiconductor chip is positioned to have a plan surface substantially common to a lower surface of the second semiconductor chip, which provides more reliable connection.

Preferably, the first and second semiconductor chips are sealed with a resin.

A third semiconductor device of the present invention comprises: a first semiconductor chip having a first electrode disposed on an upper surface thereof; and a second semiconductor chip having a second electrode disposed on an upper surface thereof, the second semiconductor chip being mounted on the first semiconductor chip with the second electrode being electrically connected to the first electrode, the second semiconductor chip having a center portion thicker than a peripheral portion thereof.

The arrangement reduces the warping of the second semiconductor chip and provides more reliable connection between the first and second semiconductor chips.

The third semiconductor device of the present invention further comprises: a resin layer interposed between the first and second semiconductor chips, thereby providing more reliable connection.

Preferably, the first and second semiconductor chips are sealed with a resin.

A first method for fabricating a semiconductor device is a method for fabricating a semiconductor device comprising a first semiconductor chip and a second semiconductor chip mounted on the first semiconductor chip with respective electrodes of the first and second semiconductor chips being electrically connected to each other, the method comprising the steps of: preparing a wafer including first semiconductor chip formation regions each having a first electrode disposed on an upper surface thereof to form the first semiconductor chip and a second semiconductor chip having a second electrode disposed on an upper surface thereof; mounting the second semiconductor chip on each of the chip formation regions of the wafer and providing electrical connection between the first and second electrodes; forming a resin layer between each of the chip formation regions of the wafer and the second semiconductor chip; polishing a lower surface of the second semiconductor chip with the second semiconductor chip being mounted on the wafer; separating the wafer into the individual chip formation regions and individually forming bonded structures each composed of the second semiconductor chip mounted on the first semiconductor chip; and sealing the second semiconductor chip on the first semiconductor chip with a sealing resin.

In accordance with the method, the corner of the lower surfaces of the second semiconductor chip is ground or polished to be chamfered. This suppresses the localization of the stress to the corner and provides a semiconductor device in which a package crack is suppressed.

A second method for fabricating a semiconductor device of the present invention is a method for fabricating a semiconductor device comprising a first semiconductor chip and a second semiconductor chip mounted on the first semiconductor chip with respective electrodes of the first and second semiconductor chips being electrically connected to each other, the method comprising the steps of: preparing a first semiconductor chip having a first electrode disposed on an upper surface thereof and a second semiconductor chip having a second electrode disposed on an upper surface thereof; mounting the second semiconductor chip on a region to be formed with the first semiconductor chip and providing electrical connection between the first and second semiconductor electrodes; forming a resin layer between the first and second semiconductor chips; polishing a lower surface of the second semiconductor chip with the second semiconductor chip being mounted on a wafer; and sealing the first and second semiconductor chips with a sealing resin.

In each of the first and second methods for fabricating semiconductor devices, the step of providing the electrical connection between the first and second electrodes preferably includes the step of: forming a bump on at least one of the first and second electrodes and connecting the first and second electrodes via the bump.

DETAILED DESCRIPTION OF THE INVENTION

Embodiment 1

Figure 1:
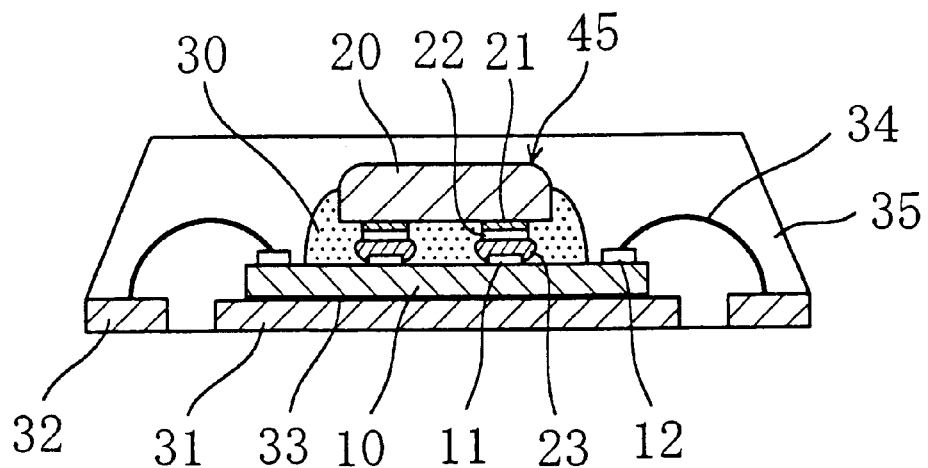
FIG. 1 is a cross-sectional view of a three-dimensional device in a first embodiment of the present invention.
Figure 2:
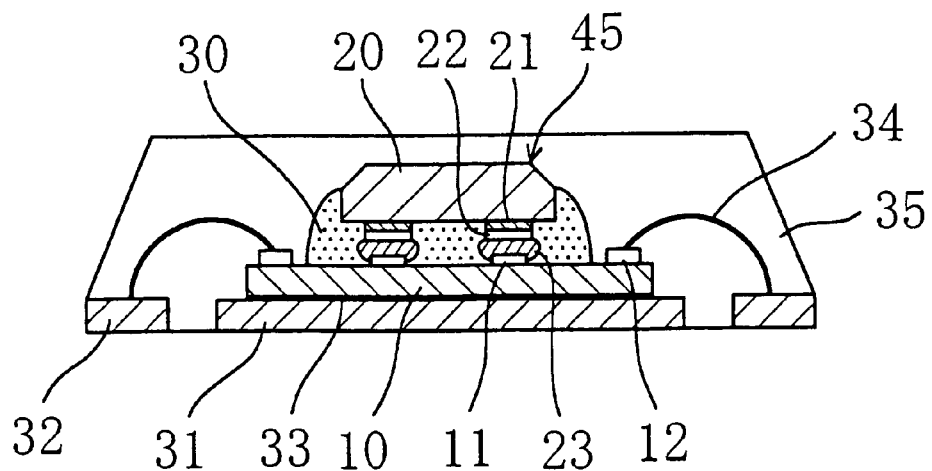
FIG. 2 is a cross-sectional view of a three-dimensional device in a variation of the first embodiment.

A description will be given herein below to respective structures of semiconductor devices according to a first embodiment of the present invention and a variation thereof. FIGS. 1 and 2 are cross-sectional views of the respective structures of three-dimensional devices in the present embodiment and in the variation thereof.

As shown in FIG. 1, the three-dimensional device according to the present embodiment comprises: a first semiconductor chip 10 having a plurality of first internal electrodes 11 and bonding pads 12 disposed on a principal surface thereof; a second semiconductor chip 20 having a plurality of second internal electrodes 21 disposed on a principal surface thereof and bonded by face-down bonding to the first semiconductor chip 10; a die pad 31 for carrying the first semiconductor chip 10; and leads 32 for transmitting electric signals between external equipment and respective elements such as transistors within and the first and second semiconductor chips 10 and 20.

The second semiconductor chip 20 is mounted on the first semiconductor chip 10 with the second internal electrodes 21 aligned with respect to the first internal electrodes 11. The first and second internal electrodes 11 and 21 are electrically connected to each other via metal bumps 23. A resin 30 is filled in the space between the first and second semiconductor chips 10 and 20 to provide adhesion therebetween, thereby integrating the first and second semiconductor chips 10 and 20 into a single device. The die pad 31 and the leads 32 have been cut off from a single lead frame. The first semiconductor chip 10 has been secured to the die pad 31 by using a conductive paste 33 containing a metal such as Pd or Ag. The bonding pads 12 of the first semiconductor chip 10 and the leads 32 are electrically connected via bonding wires 34. The first semiconductor chip 10, the second semiconductor chip 20, the bonding wires 34, the die pad 31, and the leads 32 are sealed with a sealing resin 35 to be packaged.

In the three-dimensional device according to the present embodiment, the corners 45 of the back surface of the second semiconductor chip 20 have been rounded up (curved) so that the back surface of the second semiconductor chip 20 has no acute-angled corner. This suppresses a package crack in the corner 45 of the back surface of the second semiconductor chip 20 and prevents the deterioration of the overall device characteristics.

Variation of Embodiment 1

FIG. 2 is a cross-sectional view of a three-dimensional device in a variation of the first embodiment. As shown in FIG. 2, the corners of the back surface of the second semiconductor chip 20 are not rounded up but chamfered at an angle close to 45° C. in the variation of the first embodiment. This also suppresses the occurrence of a package crack or the like. In short, it is sufficient if the corners 45 of the second semiconductor chip are blunted.

Embodiment 2

Figure 3:
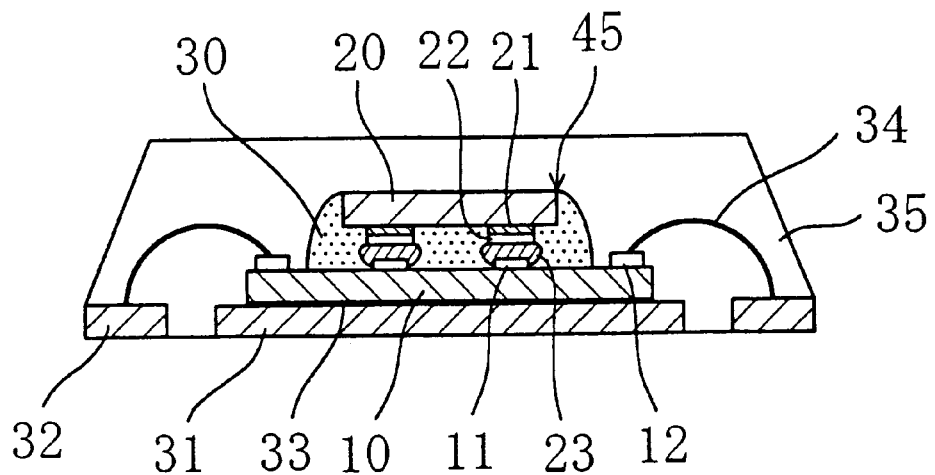
FIG. 3 is a cross-sectional view of a three-dimensional device in a second embodiment of the present invention.

FIG. 3 is a cross-sectional view showing a structure of a three-dimensional device in the present embodiment. As shown in the drawing, the three-dimensional device according to the present embodiment comprises: a first semiconductor chip 10 having a plurality of first internal electrodes 11 and bonding pads 12 disposed on a principal surface thereof; a second semiconductor chip 20 having a plurality of second internal electrodes 21 disposed on a principal surface thereof and bonded by face-down bonding to the first semiconductor chip 10; a die pad 31 for carrying the first semiconductor chip 10; and leads 32 for transmitting electric signals between external equipment and respective elements such as transistors within the first and second semiconductor chips 10 and 20.

The second semiconductor chip 20 is mounted on the first semiconductor chip 10 with the second internal electrodes 21 aligned with respect to the first internal electrodes 11. The first and second internal electrodes 11 and 21 are electrically connected to each other via metal bumps 23. A resin 30 is filled in the space between the first and second semiconductor chips 10 and 20 to provide adhesion therebetween, thereby integrating the first and second semiconductor chips 10 and 20 into a single device. The die pad 31 and the leads 32 have been cut off from a single lead frame. The first semiconductor chip 10 has been secured to the die pad 31 by using a conductive paste 33 containing a metal such as Pd or Ag. The bonding pads 12 of the first semiconductor chip 10 and the leads 32 are electrically connected via bonding wires 34. The first semiconductor chip 10, the second semiconductor chip 20, the bonding wires 34, the die pad 31, and the leads 32 are sealed with a sealing resin 35 to be packaged.

In the three-dimensional device according to the present embodiment, the entire side surfaces of the second semiconductor chip 20 are covered with the resin 30. Accordingly, the corners 45 of the second semiconductor chip 20 are protected by the resin 30, which suppresses a package crack in the corner 45 of the back surface of the second semiconductor chip 20 and prevents the deterioration of the overall device characteristics. Since the resin 30 provided strong adhesion between the first and second semiconductor chips 10 and 20 prior to performing resin sealing, the pealing off of the first and second semiconductor chips 10 and 20 in the mounting step can effectively be prevented so that the reliability of the connection is improved.

Variation 1 of Embodiment 2

Figure 4:
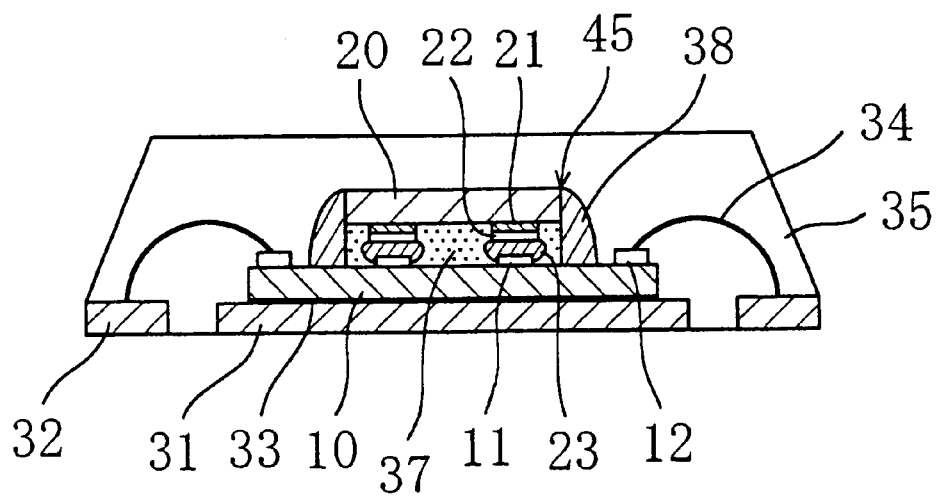
FIG. 4 is a cross-sectional view of a semiconductor device in a first variation of the second embodiment.

FIG. 4 is a cross-sectional view showing a structure of a three-dimensional device in a first variation of the second embodiment.

As shown in the drawing, the three-dimensional device according to the present variation comprises: the first semiconductor chip 10 having the plurality of first internal electrodes 11 and the bonding pads 12 disposed on the principal surface thereof; the second semiconductor chip 20 having the plurality of second internal electrodes 21 disposed on the principal surface thereof and bonded by face-down bonding to the first semiconductor chip 10; the die pad 31 for carrying the first semiconductor chip 10; and the leads 32 for transmitting electric signals between external equipment and the respective elements such as transistors within the first and second semiconductor chips 10 and 20, similarly to the three-dimensional device shown in FIG. 3.

The second semiconductor chip 20 is mounted on the first semiconductor chip 10 with the second internal electrodes 21 aligned with respect to the first internal electrodes 11. The first and second internal electrodes 11 and 21 are electrically connected to each other via the metal bumps 23. The die pad 31 and the leads 32 have been cut off from a single lead frame. The first semiconductor chip 10 has been secured to the die pad 31 by using the conductive paste 33 containing a metal such as Pd or Ag. The bonding pads 12 of the first semiconductor chip 10 and the leads 32 are electrically connected via the bonding wires 34.

In the present variation, a first resin 37 is filled in the space between the first and second semiconductor chips 10 and 20 to provide adhesion therebetween, thereby integrating the first and second semiconductor chips 10 and 20 into a single device. In addition, a second resin 38 is further provided on the first semiconductor chip 10 to cover the respective side surfaces of the first resin 37 and the second semiconductor chip 20.

The first semiconductor chip 10, the second semiconductor chip 20, the bonding wires 34, the die pad 31, and the leads 32 are sealed with the sealing resin 35 to be packaged.

In the present variation also, the entire side surfaces of the second semiconductor chip 20 are covered with the second resin 38 so that the corners 45 of the second semiconductor chip 20 are protected by the second resin 38, which suppresses a package crack in the corner 45 of the back surface of the second semiconductor chip 20 and prevents the deterioration of the overall device characteristics. Since the resins 37 and 38 provided strong adhesion between the first and second semiconductor chips 10 and 20 prior to performing resin sealing, the pealing off of the first and second semiconductor chips 10 and 20 in the mounting step can effectively be prevented so that the reliability of the connection is improved.

By composing the resin layer of the first and second resins 37 and 38 which are two types of resins having different compositions, the following effects are achievable. If the quantity of fillers contained in the second resin 38 is larger than the quantity of fillers contained in the first resin 37 or if the average diameter of the fillers contained in the second resin 38 is larger than the average diameter of the fillers contained in the first resin 37, the second resin 38 has a higher elastic coefficient so that the function of protecting the corners of the second semiconductor chip 20 is improved. Since the thermal expansion coefficient of the second resin 38 approaches the respective thermal expansion coefficients of the first and second semiconductor chips 10 and 20, the function of preventing warping is also enhanced.

Variation 2 of Embodiment 2

Figure 5:
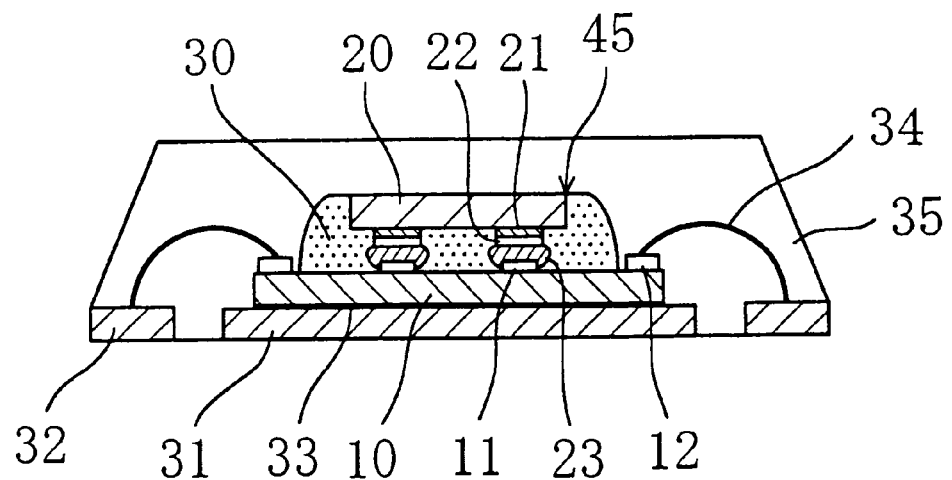
FIG. 5 is a cross-sectional view of a semiconductor device in a second variation of the second embodiment.

FIG. 5 is a cross-sectional view showing a structure of a three-dimensional device in a second variation of the second embodiment.

As shown in the drawing, the three-dimensional device according to the present variation comprises: the first semiconductor chip 10 having the plurality of first internal electrodes 11 and the bonding pads 12 disposed on the principal surface thereof; the second semiconductor chip 20 having the plurality of second internal electrodes 21 disposed on the principal surface thereof and bonded by face-down bonding to the first semiconductor chip 10; the die pad 31 for carrying the first semiconductor chip 10; and the leads 32 for transmitting electric signals between external equipment and the respective elements such as transistors within the first and second semiconductor chips 10 and 20.

The second semiconductor chip 20 is mounted on the first semiconductor chip 10 with the second internal electrodes 21 aligned with respect to the first internal electrodes 11. The first and second internal electrodes 11 and 21 are electrically connected to each other via the metal bumps 23. The resin 30 is filled in the space between the first and second semiconductor chips 10 and 20 to provide adhesion therebetween, thereby integrating the first and second semiconductor chips 10 and 20 into a single device. The die pad 31 and the leads 32 have been cut off from a single lead frame. The first semiconductor chip 10 has been secured to the die pad 31 by using the conductive paste 33 containing a metal such as Pd or Ag. The bonding pads 12 of the first semiconductor chip 10 and the leads 32 are electrically connected via the bonding wires 34. The first semiconductor chip 10, the second semiconductor chip 20, the bonding wires 34, the die pad 31, and the leads 32 are sealed with the sealing resin 35 to be packaged.

In the three-dimensional device according to the present embodiment, the entire surfaces of the second semiconductor chip 20 are covered with the resin 30 which has an upper end surface forming a plan surface substantially common to the back surface of the second semiconductor chip 20. That is, the side surfaces of the second semiconductor chip 20 converging to the corners 45 of the back surface thereof are covered laterally thick with the resin 30. This achieves a higher effect of protecting the corners 45 of the second semiconductor chip 20 than in the structure shown in FIG. 3.

Variation 3 of Embodiment 2

Figure 6:
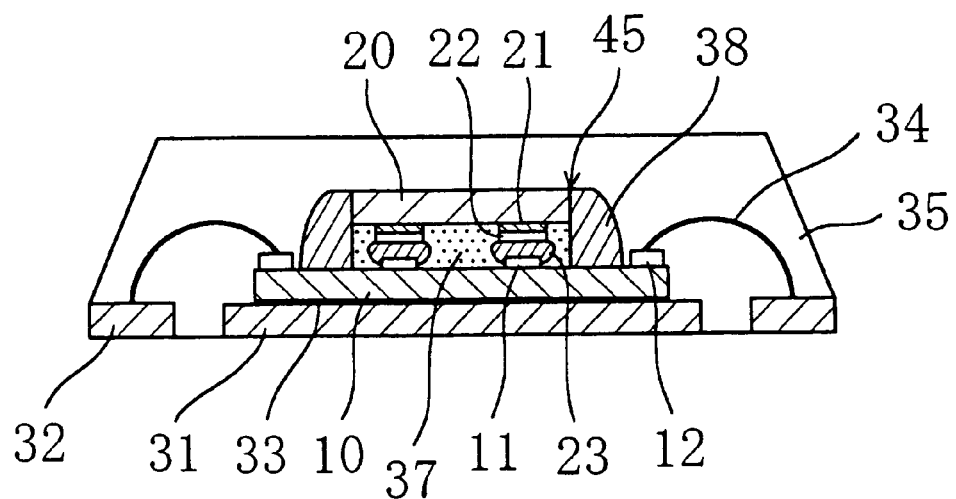
FIG. 6 is a cross-sectional view of a semiconductor device in a third variation of the second embodiment.

FIG. 6 is a cross-sectional view showing a structure of a three-dimensional device in a third variation of the second embodiment.

As shown in the drawing, the three-dimensional device according to the present variation comprises: the first semiconductor chip 10 having the plurality of first internal electrodes 11 and the bonding pads 12 disposed on the principal surface thereof; the second semiconductor chip 20 having the plurality of second internal electrodes 21 disposed on the principal surface thereof and bonded by face-down bonding to the first semiconductor chip 10; the die pad 31 for carrying the first semiconductor chip 10; and the leads 32 for transmitting electric signals between external equipment and the respective elements such as transistors within the first and second semiconductor chips 10 and 20, similarly to the three-dimensional device shown in FIG. 3.

The second semiconductor chip 20 is mounted on the first semiconductor chip 10 with the second internal electrodes 21 aligned with respect to the first internal electrodes 11. The first and second internal electrodes 11 and 21 are electrically connected to each other via the metal bumps 23. The die pad 31 and the leads 32 have been cut off from a single lead frame. The first semiconductor chip 10 has been secured to the die pad 31 by using the conductive paste 33 containing a metal such as Pd or Ag. The bonding pads 12 of the first semiconductor chip 10 and the leads 32 are electrically connected via the bonding wires 34.

In the present variation, the first resin 37 is filled in the space between the first and second semiconductor chips 10 and 20 to provide adhesion therebetween, thereby integrating the first and second semiconductor chips 10 and 20 into a single device. In addition, the second resin 38 is further provided on the first semiconductor chip 10 to cover the respective side surfaces of the first resin 37 and the second semiconductor chip 20, while having an upper end surface forming a plan surface substantially common to the back surface of the second semiconductor chip 20. That is, the side surfaces of the second semiconductor chip 20 converging to the corners 45 of the back surface thereof are covered laterally thick with the second resin 38. This achieves an higher effect of protecting the corners 45 of the second semiconductor chip 20 than in the structure shown in FIG. 3.

Embodiment 3

Figure 7:
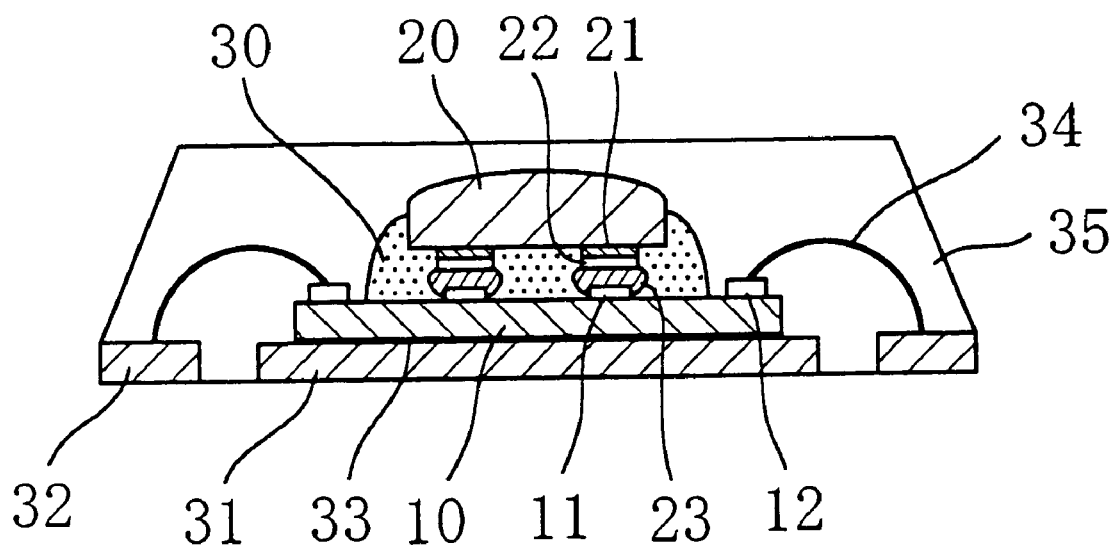
FIG. 7 is a cross-sectional view of a three-dimensional device in a third embodiment of the present invention.

FIG. 7 is a cross-sectional view showing a structure of a semiconductor device in a third embodiment of the present invention. As shown in the drawing, the three-dimensional device according to the present embodiment comprises: a first semiconductor chip 10 having a plurality of first internal electrodes 11 and bonding pads 12 disposed on a principal surface thereof; a second semiconductor chip 20 having a plurality of second internal electrodes 21 disposed on a principal surface thereof and bonded by face-down bonding to the first semiconductor chip 10; a die pad 31 for carrying the first semiconductor chip 10; and leads 32 for transmitting electric signals between external equipment and respective elements such as transistors within the first and second semiconductor chips 10 and 20.

The second semiconductor chip 20 is mounted on the first semiconductor chip 10 with the second internal electrodes 21 aligned with respect to the first internal electrodes 11. The first and second internal electrodes 11 and 21 are electrically connected to each other via metal bumps 23. A resin 30 is filled in the space between the first and second semiconductor chips 10 and 20 to provide adhesion therebetween, thereby integrating the first and second semiconductor chips 10 and 20 into a single device. The die pad 31 and the leads 32 have been cut off from a single lead frame. The first semiconductor chip 10 has been secured to the die pad 31 by using a conductive paste 33 containing a metal such as Pd or Ag. The bonding pads 12 of the first semiconductor chip 10 and the leads 32 are electrically connected via bonding wires 34. The first semiconductor chip 10, the second semiconductor chip 20, the bonding wires 34, the die pad 31, and the leads 32 are sealed with a sealing resin 35 to be packaged.

In the three-dimensional device according to the present embodiment, the second semiconductor chip 20 has a center portion thicker than a peripheral portion thereof. Consequently, the three-dimensional device of the present embodiment suppresses a package crack in the second semiconductor chip 20 and prevents the deterioration of the overall device characteristics.

Although the side surfaces of the second semiconductor chip 20 are not entirely covered with the resin 30 and only the lower portions thereof are covered with the resin 30 in the three-dimensional device of the present embodiment, the side surfaces of the semiconductor chip 20 may also be covered entirely with the resin 30, similarly to the second embodiment.

Embodiment 4

A description will be given herein below to a method for fabricating a semiconductor device according to a fourth embodiment of the present invention. The fourth embodiment will describe a method for fabricating the semiconductor device according to the first embodiment described above. FIGS. 8A to 8F are cross-sectional views illustrating the process steps for fabricating the semiconductor device in the present embodiment.

Figure 8A:
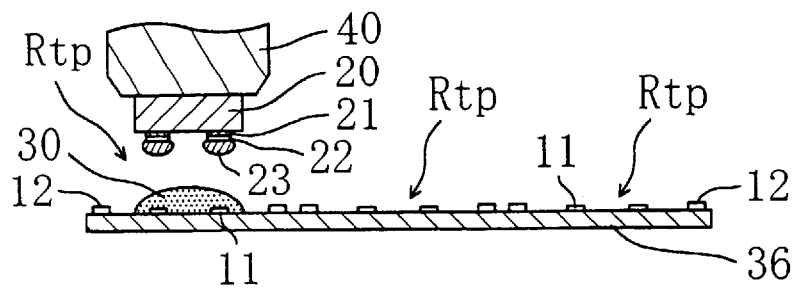
FIGS. 8A to 8F are cross-sectional views illustrating the process steps for fabricating a semiconductor device in a fourth embodiment of the present invention.

In the step shown in FIG. 8A, a wafer 36 having a large number of chip formation regions Rtp in each of which the first semiconductor chip 10 is to be formed is aligned with the second semiconductor chip 20 by the following procedure. First, the wafer 36 having the large number of chip formation regions Rtp is prepared. In each of the chip formation regions Rtp of the wafer 36, a semiconductor element and wiring have been formed. The plurality of first internal electrodes 11 composed of aluminum and the plurality of bonding pads 12 composed of aluminum are provided on the upper surface of each of the chip formation regions Rtp. The wafer 36 is placed on a mounting jig (not shown) and the resin 30 composed of epoxy or the like is applied to the upper surface of one of the chip formation regions Rtp of the wafer 36. The resin 30 may be composed of a thermosetting resin or a cold setting resin instead of epoxy. The material of the resin 30 may be an acrylic resin, a polyimide resin, an urethane resin, or the like. The resin is applied by a dispensing, printing, stamping, or like method. A proper method is selected based on a chip size and the like. The application of the resin is not limited to the chip formation region Rtp of the wafer 36. It is also possible to apply the resin to the second semiconductor chip 20 instead.

Figure 8B:
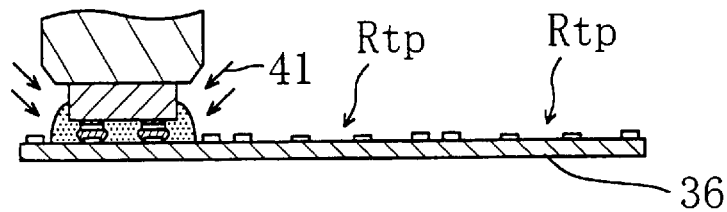

The timing of applying the resin 30 is not necessarily before the alignment shown in FIG. 8A and may also be after the alignment and the bonding of the internal electrodes 11 and 12 via the metal bumps 23 (in the step shown in FIG. 8B).

Meanwhile, the second semiconductor chip 20 having the plurality of second internal electrodes 21 composed of aluminum and disposed on the principal surface thereof and barrier metal layers 22 over the second internal electrodes 21 is prepared and the metal bumps 23 are formed on the barrier metal layers 22 of the second semiconductor chip 20. Each of the barrier metal layers 22 is composed of a Ti/Cu/Ni metal thin film, while each of the metal bumps 23 is composed of Sn—Pb. As the material of the metal bumps 23, any one of Au, In, In—Sn, Sn—Ag, Sn—Cu, Sn—Zn, Cu, and Ni can be used selectively. Each of the metal bumps 23 has a diameter of 3 to 10 µm and a height of 3 to 50 µm.

The second semiconductor chip 20 which is held above one of the chip formation region Rtp of the wafer 36 by using a tool 40 is opposed to the chip formation region Rtp of the wafer 36 with the back surface thereof facing downward.

As a member for providing electrical connection, there may be used a conductive paste, an anisotropic conductive resin, a metal filler dispersed resin, or the like instead of the metal bumps 23. It is also possible to form the metal bumps on the first internal electrodes 11 on the chip formation region Rtp of the wafer 36, similarly to the second internal electrodes 21 of the second semiconductor chip 20.

Next, in the step shown in FIG. 8B, the chip formation regions Rtp of the wafer 36 and the second semiconductor chip 20 are bonded to each other by the following procedure.

First, the second semiconductor chip 20 which is held by the tool 40 is lowered in level such that the metal bumps 23 formed on the second internal electrodes 21 of the second semiconductor chip 20 are aligned with respect to the first internal electrodes 11 disposed on one of the chip formation regions Rtp of the wafer 36. The first internal electrodes 11 on the wafer 36 and the metal bumps 23 of the second semiconductor chip 20 that have been aligned are heated and pressed to be bonded by using a physical or metallurgical effect (such as the effect of alloying due to atomic interdiffusion). In the case of applying the resin 30 before bonding (in the step shown in FIG. 8A), the resin 30 is spread under pressure between the chip formation region Rtp of the wafer 46 and the second semiconductor chip 20 when the internal electrodes 11 and 12 are bonded to each other by lowering the tool 40. At this time, the viscosity of the resin 30 further increases the provisional securing force between the second semiconductor chip 20 and the wafer 36. As for the pressing force applied by the tool 40, a load of about 0.1 to 20 g on each of the metal bumps 23 is appropriate. The magnitude of the load is determined under the constraint that it does not damage the first internal electrodes 11 nor change the respective characteristics of the semiconductor element such as a transistor and the wiring formed under the first internal electrodes 11. Thereafter, the second semiconductor chip 20 and the wafer 36 are integrated by curing the resin 30. For the integration, the resin 30 is irradiated with UV light 41 if it is photo-setting or the resin 30 is heated if it is thermosetting. If the resin 30 is cured by heating, heating is performed by using a heating tool such as an oven after the pressure applied by the tool 40 is removed or direct heating is performed by using a heater provided in the tool 40 or the like under the pressure. To cure the thermosetting resin 30, a temperature of about 70 to 300° C. is required, though it differs depending on the material of the resin 30.

Figure 8C:
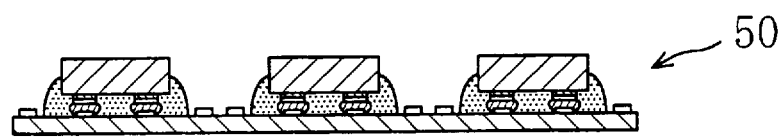

Next, in the step shown in FIG. 8C, the steps shown in FIGS. 8A and 8B are repeated by the number of times corresponding to the number of the second semiconductor chips 20 to be mounted on the respective chip formation regions Rtp of the wafer 36, whereby bonded structures 50 composed of the large number of second semiconductor chips 20 mounted on the wafer 36 are obtained as shown in FIG. 8C. As a replacement for the resin 30 to be filled in the space between the semiconductor chips and the wafer, an ACF (Anisotropic Conductor Film) or ACP (Anisotropic Conductor Paste) containing an epoxy resin, acrylic resin, or the like as a resin component and containing Au, Ni, Ag, or the like as conductor particles may also be used.

Figure 8D:
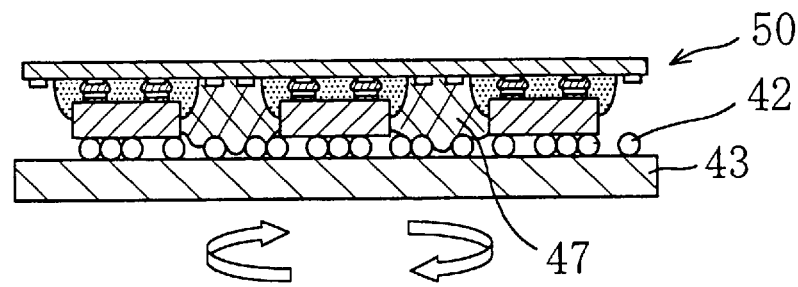

Next, in the step shown in FIG. 8D, the back surfaces of the second semiconductor chips 20 in the bonded structures 50 are polished. After the resin 30 is cured satisfactorily in the step shown in FIG. 8C, the bonded structures 50 are placed on a polisher 43 with the back surfaces (surfaces facing upward) of the second semiconductor chips 20 mounted on the respective chip formation regions Rtp of the wafer 36 opposed to the upper surface of the polisher 43. A protecting resin 47 has been provided on each of the regions of the wafer 36 interposed between the chip formation regions Rtp. The back surfaces of the second semiconductor chips 20 are then polished by supplying abrasive grains 42 to a polishing surface of the polisher 43 and rotating the polisher 43 while applying a load on each of the bonded structures 50. As the abrasive grains 42, diamond grains each having a grain size of about #1200 to #2000 are preferably used. Preferably, the polisher 43 has a number of revolutions of about 5 to 50 rpm.

Figure 8E:
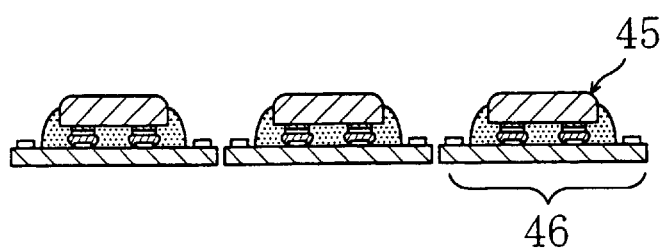
Figure 15:
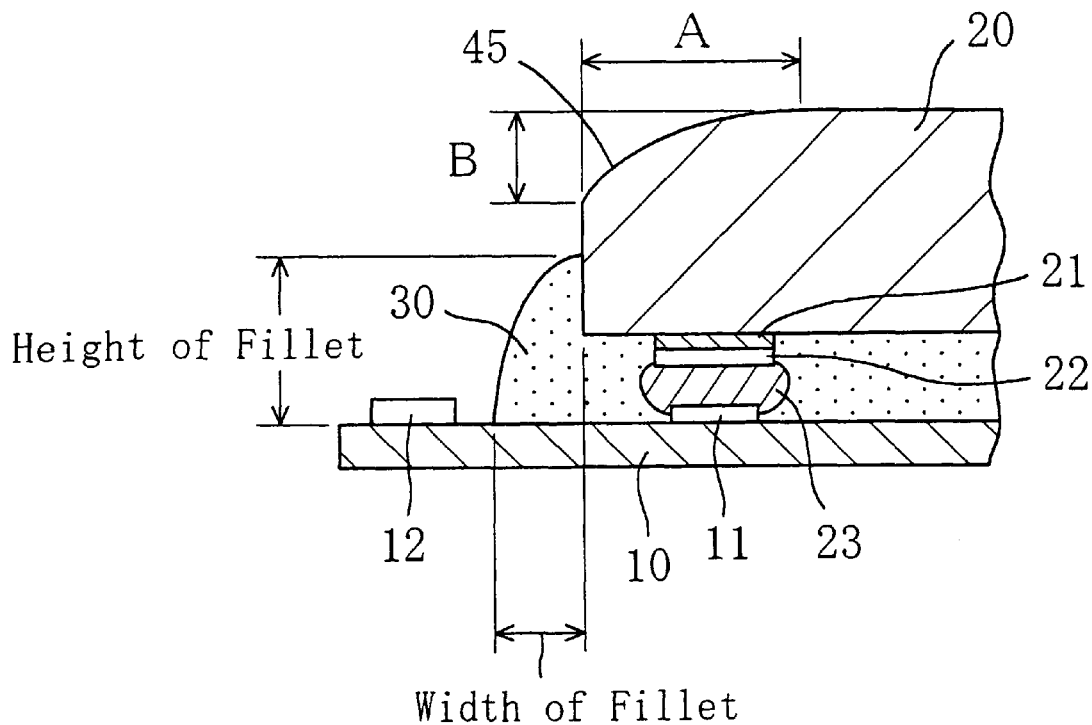
FIG. 15 is a cross-sectional view showing in detail a corner of a back surface of a second semiconductor chip in the first embodiment.

Next, in the step shown in FIG. 8E, the polishing is completed and each of the bonded structures 50 is retrieved from the polisher 43. What results is a configuration in which the corners 45 of the back surface of the second semiconductor chips 20 are blunted and curved above the wafer 36. FIG. 15 shows an exemplary configuration of each of the corners 45 of the back surface of the second semiconductor chips 20, in which a chip lateral dimension A is about 1 to 10 µm and a chip longitudinal dimension B is about 1 to 10 µm. Thereafter, the wafer 36 is diced into the individual chip formation regions Rtp of the bonded structures 50, whereby semiconductor devices 46 each composed of the first semiconductor chip 10 and the second semiconductor chip 20 are obtained.

Figure 8F:
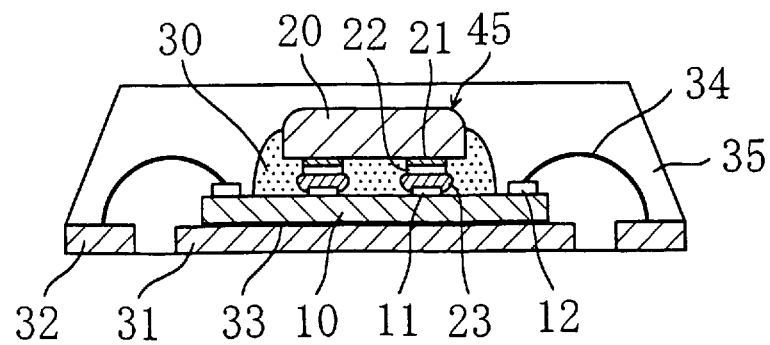

Next, in the step shown in FIG. 8F, each of the semiconductor devices 46 is packaged. First, the semiconductor device 46 is mounted on the die pad 31 of the lead frame and secured thereto by using the conductive paste 33 containing Pd, Ag, or the like. Then, the bonding pads 12 of the first semiconductor chip 10 and the leads 32 of the lead frame are connected to each other with bonding wires 34 each having a diameter of about 25 µm φand composed of Au, Al, or the like. Finally, the first semiconductor chip 10, the second semiconductor chip 20, the bonding wires 34, the die pad 31 of the lead frame, and part of the leads 32 of the lead frame are sealed with the epoxy- or polyimide-based sealing resin 35.

By the foregoing process steps, the three-dimensional device according to the first embodiment which is composed of the second semiconductor chip 20 mounted on and integrated with the first semiconductor chip 10 is formed easily.

Variation of Embodiment 4

A description will be given herein below to a method for fabricating a semiconductor device according to a variation of the fourth embodiment. FIGS. 9A to 9E are cross-sectional views illustrating the process steps for fabricating the semiconductor device in the variation of the fourth embodiment. In the present variation, the second semiconductor chip 20 is bonded onto the first semiconductor chip 10 that has been formed preliminarily by dicing the wafer.

Figure 9A:
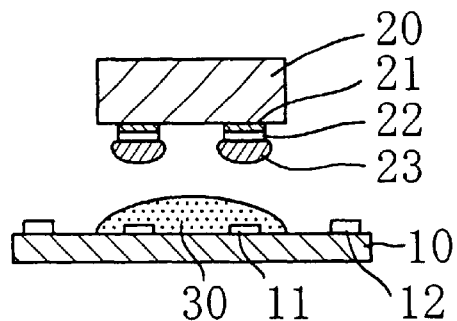
FIGS. 9A to 9E are cross-sectional views illustrating the process steps for fabricating a semiconductor device in a variation of the fourth embodiment.

In the step shown in FIG. 9A, the second semiconductor chip 20 is aligned with respect to the first semiconductor chip 10. At this time, the same conditions as described with reference to FIG. 8A are used appropriately except for the following. The resin 30 may be composed of a thermosetting resin or a cold setting resin instead of epoxy. The material of the resin 30 may be an acrylic resin, a polyimide resin, an urethane resin, or the like. The resin is applied by a dispensing, printing, stamping, or like method. A proper method is selected based on a chip size and the like. The application of the resin is not limited to the wafer 36 on which the first semiconductor chip 10 is disposed. It is also possible to apply the resin to the second semiconductor chip 20 instead.

Figure 9B:
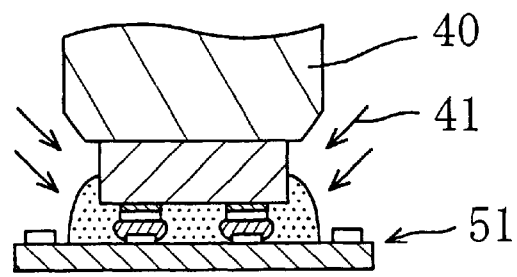

The timing of applying the resin 30 is not necessarily before the alignment shown in FIG. 9A and may also be after the alignment and the bonding of the internal electrodes 11 and 12 via the metal bumps 23 (in the step shown in FIG. 9B).

As the material of the metal bumps 23 formed above the second semiconductor chip 20, any one of Au, In, In—Sn, Sn—Ag, Sn—Cu, Sn—Zn, Cu, and Ni can be used selectively. Each of the metal bumps 23 has a diameter of 3 to 10 $\mu$m and a height of 3 to 50 $\mu$m.

The second semiconductor chip 20 which is held above the first semiconductor chip 10 by using a tool 40 is opposed to the first semiconductor chip 10 with the back surface thereof facing downward.

As a member for providing electrical connection, there may be used a conductive paste, an anisotropic conductive resin, a metal filler dispersed resin, or the like instead of the metal bumps 23. It is also possible to form the metal bumps not on the second internal electrodes 21 of the second semiconductor chip 20 but on the first internal electrodes 11 of the first semiconductor chip 10.

Next, in the step shown in FIG. 9B, the second semiconductor chip 20 is mounted on the first semiconductor chip 10 by the same procedure as shown in FIG. 8B. Then, the internal electrodes 11 and 12 of the first and second semiconductor chips 10 and 20 are bonded to each other and the resin 30 is cured, whereby a bonded structure 51 composed of the second semiconductor chip 20 mounted on the first semiconductor chip 10 is formed.

Figure 9C:
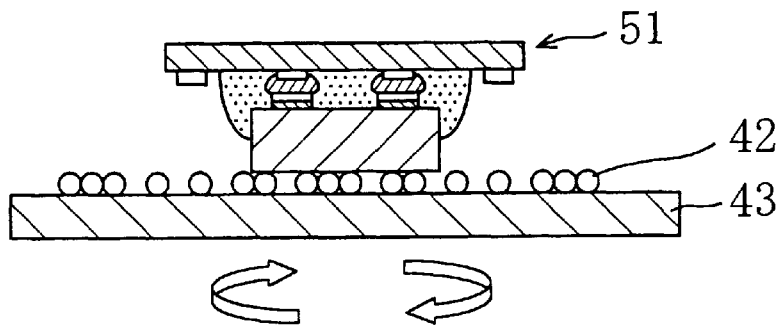
Figure 9D:
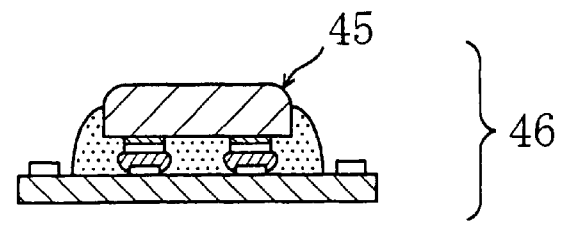
Figure 9E:
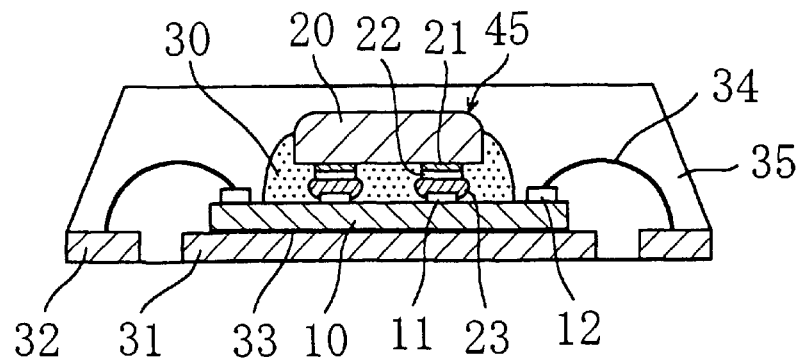

Next, in the steps shown in FIGS. 9C to 9E, the step of polishing the back surface of the second semiconductor chip 20 of the bounded structure 51, the wire bonding step, the packaging step, and the like are performed by the same procedure as used in the steps shown in FIGS. 8D to 8F.

Since the present variation individually polishes, in the step shown in FIG. 9C, the back surface of the second semiconductor chip 20 of the bounded structure 51 composed of the first and second semiconductor chips 10 and 20 bonded to each other, abrasive grains 42 are supplied more smoothly to the corners 45 of the back surface of the second semiconductor chip 20 so that easier polishing is performed than in the method according to the fourth embodiment.

Embodiment 5

A description will be given herein below to a method for fabricating a semiconductor device according to a fifth embodiment of the present invention. The fifth embodiment will describe a method for fabricating the semiconductor device according to the second embodiment described above. FIGS. 10A to 10F are cross-sectional views illustrating the process steps for fabricating the semiconductor device in the present embodiment.

Figure 10A:
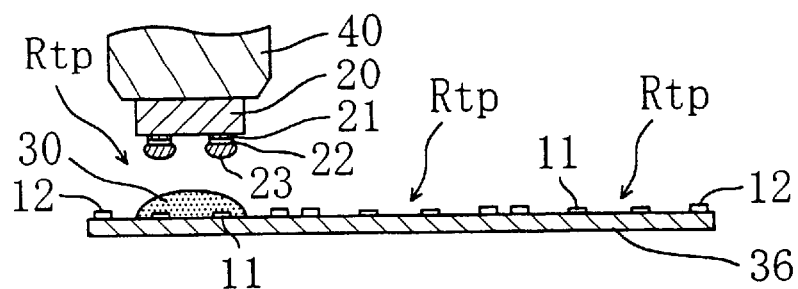
FIGS. 10A to 10F are cross-sectional views illustrating the process steps for fabricating a semiconductor device in a fifth embodiment of the present invention.

In the step shown in FIG. 10A, the second semiconductor chip 20 is aligned with respect to a wafer 36 having a large number of chip formation regions Rtp in each of which the first semiconductor chip 10 is to be formed by the following procedure. First, the wafer 36 having the large number of chip formation regions Rtp is prepared. In each of the chip formation regions Rtp of the wafer 36, a semiconductor element and wiring have been formed. The plurality of first internal electrodes 11 composed of aluminum and the plurality of bonding pads 12 composed of aluminum are provided on the upper surface of each of the chip formation regions Rtp. The wafer 36 is placed on a mounting jig (not shown) and the resin 30 composed of epoxy or the like is applied to the upper surface of one of the chip formation regions Rtp of the wafer 36. The resin 30 may be composed of a thermosetting resin or a cold setting resin instead of epoxy. The material of the resin 30 may be an acrylic resin, a polyimide resin, an urethane resin, or the like. The resin is applied by a dispensing, printing, stamping, or like method. A proper method is selected based on a chip size and the like. The application of the resin is not limited to the chip formation region Rtp of the wafer 36. It is also possible to apply the resin to the second semiconductor chip 20 instead.

Figure 10B:
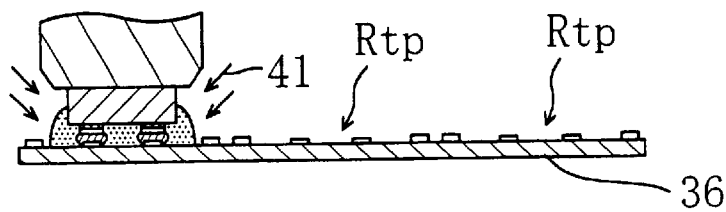

The timing of applying the resin 30 is not necessarily before the alignment shown in FIG. 10A and may also be after the alignment and the bonding of the internal electrodes 11 and 12 via the metal bumps 23 (in the step shown in FIG. 10B).

In the present embodiment, the resin 30 should be applied in an amount sufficient to form a fillet made of the resin on the side surface of the second semiconductor chip 20, though it differs depending on conditions determined by the types of the semiconductor chips, especially the area of the second semiconductor chip 20 and the like. Specifically, the resin 30 is preferably applied in an amount such that the height or width of the fillet of the cured resin 30 is about 15 to 300 $\mu$m or more (see FIG. 15)

Meanwhile, the second semiconductor chip 20 having the plurality of second internal electrodes 21 composed of aluminum and disposed on the principal surface thereof and barrier metal layers 22 over the second internal electrodes 21 is prepared and the metal bumps 23 are formed on the barrier metal layers 22 of the second semiconductor chip 20. Each of the barrier metal layers 22 is composed of a Ti/Cu/Ni metal thin film, while each of the metal bumps 23 is composed of Sn—Pb. As the material of the metal bumps 23, any one of Au, In, In—Sn, Sn—Ag, Sn—Cu, Sn—Zn, Cu, and Ni can be used selectively. Each of the metal bumps 23 has a diameter of 3 to 10 $\mu$m and a height of 3 to 50 $\mu$m.

The second semiconductor chip 20 which is held above one of the chip formation region Rtp of the wafer 36 by using a tool 40 is opposed to the chip formation region Rtp of the wafer 36 with the back surface thereof facing downward.

As a member for providing electrical connection, there may be used a conductive paste, an anisotropic conductive resin, a metal filler dispersed resin, or the like instead of the metal bumps 23. It is also possible to form the metal bumps on the first internal electrodes 11 on the chip formation region Rtp of the wafer 36, not on the second internal electrodes 21 of the second semiconductor chip 20.

Next, in the step shown in FIG. 10B, the chip formation region Rtp of the wafer 36 and the second semiconductor chip 20 are bonded to each other by the following procedure.

First, the second semiconductor chip 20 which is held by the tool 40 is lowered in level such that the metal bumps 23 formed on the second internal electrodes 21 of the second semiconductor chip 20 are aligned with respect to the first internal electrodes 11 disposed on one of the chip formation regions Rtp of the wafer 36. The first internal electrodes 11 on the wafer 36 and the metal bumps 23 of the second semiconductor chip 20 that have been aligned are heated and pressed to be bonded by using a physical or metallurgical effect (such as the effect of alloying due to atomic interdiffusion). In the case of applying the resin 30 before bonding (in the step shown in FIG. 10A), the resin 30 is spread under pressure between the chip formation region Rtp of the wafer 46 and the second semiconductor chip 20 when the internal electrodes 11 and 12 are bonded to each other by lowering the tool 40. At this time, the viscosity of the resin 30 further increases the provisional securing force between the second semiconductor chip 20 and the wafer 36. As for the pressing force applied by the tool 40, a load of about 0.1 to 20 g on each of the metal bumps 23 is appropriate. The magnitude of the load is determined under the constraint that it does not damage the first internal electrodes 11 nor change the respective characteristics of the semiconductor element such as a transistor and the wiring formed under the first internal electrodes 11. Thereafter, the second semiconductor chip 20 and the wafer 36 are integrated by curing the resin 30. For the integration, the resin 30 is irradiated with UV light 41 if it is photo-setting or the resin 30 is heated if it is thermosetting. If the resin 30 is cured by heating, heating is performed by using a heating tool such as an oven after the pressure applied by the tool 40 is removed or direct heating is performed by using a heater provided in the tool 40 or the like under the pressure. To cure the thermosetting resin 30, a temperature of about 70 to 300° C. is required, though it differs depending on the material of the resin 30.

Figure 10C:
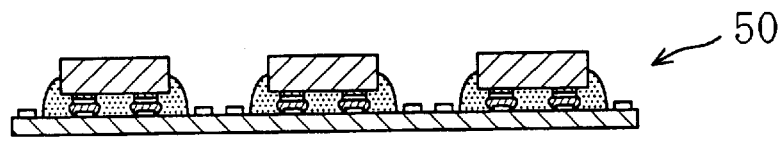

Next, in the step shown in FIG. 10C, the steps shown in FIGS. 10A and 10B are repeated by the number of times corresponding to the number of the second semiconductor chips 20 to be mounted on the respective chip formation regions Rtp of the wafer 36, whereby bonded structures 50 composed of the large number of second semiconductor chips 20 mounted on the wafer 36 are obtained as shown in FIG. 10C. As a replacement for the resin 30 to be filled in the space between the semiconductor chips and the wafer, an ACF (Anisotropic Conductor Film) or ACP (Anisotropic Conductor Paste) may also be used.

Figure 10D:
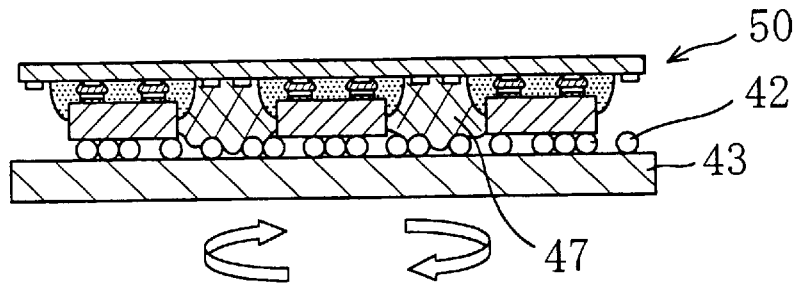

Next, in the step shown in FIG. 10D, the back surfaces of the second semiconductor chips 20 in the bonded structures 50 are polished. After the resin 30 is cured satisfactorily in the step shown in FIG. 10C, the bonded structures 50 are placed on a polisher 43 with the back surfaces (surfaces facing upward) of the second semiconductor chips 20 mounted on the respective chip formation regions Rtp of the wafer 36 opposed to the upper surface of the polisher 43. A protecting resin 47 has been provided on each of the regions of the wafer 36 interposed between the chip formation regions Rtp. The back surfaces of the second semiconductor chips 20 are then polished by supplying abrasive grains 42 to a polishing surface of the polisher 43 and rotating the polisher 43 while applying a load on each of the bonded structure 50. As the abrasive grains 42, diamond grains each having a grain size of about #1200 to #2000 are preferably used. Preferably, the polisher 43 has a number of revolutions of about 5 to 50 rpm.

In the present embodiment, the back surfaces of the second semiconductor chip 20 are polished till the upper ends of the portions of the resin 30 located on the side surfaces of the second semiconductor chip 20 are exposed.

Figure 10E:
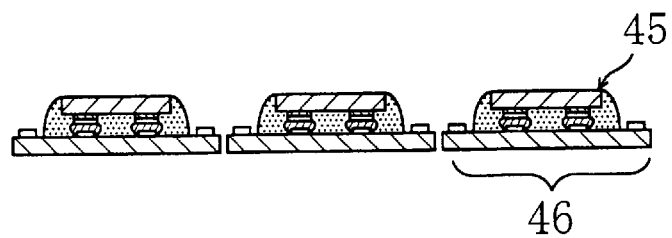

Next, in the step shown in FIG. 10E, the polishing is completed and each of the bonded structures 50 is retrieved from the polisher 43. What results is a configuration in which the side surfaces of each of the second semiconductor chips 20 on the wafer 36 are covered entirely with the resin 30.

Thereafter, the wafer 36 is diced into the individual chip formation regions Rtp of the bonded structures 50, whereby semiconductor devices 46 each composed of the first semiconductor chip 10 and the second semiconductor chip 20 are obtained.

Figure 10F:
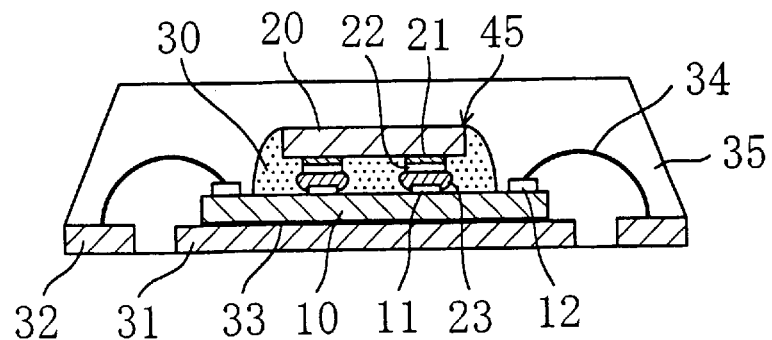

Next, in the step shown in FIG. 10F, each of the semiconductor devices 46 is packaged. First, the semiconductor device 46 is mounted on the die pad 31 of the lead frame and secured thereto by using the conductive paste 33 containing Pd, Ag, or the like. Then, the bonding pads 12 of the first semiconductor chip 10 and the leads 32 of the lead frame are connected to each other with bonding wires 34 each having a diameter of about 25 μm φ and composed of Au, Al, or the like. Finally, the first semiconductor chip 10, the second semiconductor chip 20, the bonding wires 34, the die pad 31 of the lead frame, and part of the leads 32 of the lead frame are sealed with the epoxy- or polyimide-based sealing resin 35.

By the foregoing process steps, the three-dimensional device according to the second embodiment which is composed of the second semiconductor chip 20 mounted on and integrated with the first semiconductor chip 10 is formed easily.

Variation 1 of Embodiment 5

A description will be given herein below to a method for fabricating a semiconductor device according to a first variation of the fifth embodiment. FIGS. 11A to 11E are cross-sectional views illustrating the process steps for fabricating the semiconductor device in the first variation of the fifth embodiment. In the present variation, the second semiconductor chip 20 is bonded onto the first semiconductor chip 10 that has been formed preliminarily by dicing the wafer.

Figure 11A:
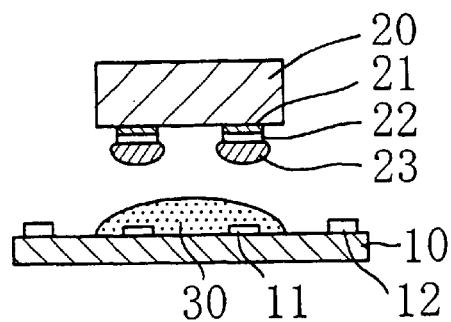
FIGS. 11A to 11E are cross-sectional views illustrating the process steps for fabricating a semiconductor device in a first variation of the fifth embodiment.

In the step shown in FIG. 11A, the second semiconductor chip 20 is aligned with respect to the first semiconductor chip 10. At this time, the same conditions as described with reference to FIG. 10A are used appropriately except for the following. The resin 30 may be composed of a thermosetting resin or a cold setting resin instead of epoxy. The material of the resin 30 may be an acrylic resin, a polyimide resin, an urethane resin, or the like. The resin is applied by a dispensing, printing, stamping, or like method. A proper method is selected based on a chip size and the like. The application of the resin is not limited to the wafer 36 on which the first semiconductor chip 10 is disposed. It is also possible to apply the resin to the second semiconductor chip 20 instead.

Figure 11B:
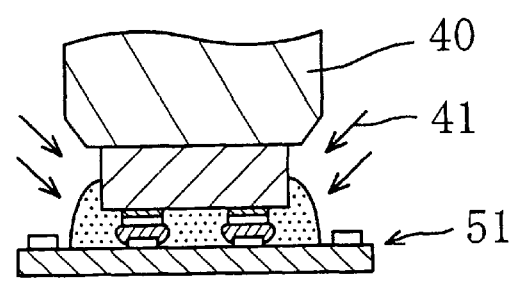

The timing of applying the resin 30 is not necessarily before the alignment shown in FIG. 11A and may also be after the alignment and the bonding of the internal electrodes 11 and 12 via the metal bumps 23 (in the step shown in FIG. 11B).

As the material of the metal bumps 23 formed above the second semiconductor chip 20, any one of Au, In, In—Sn, Sn—Ag, Sn—Cu, Sn—Zn, Cu, and Ni can be used selectively. Each of the metal bumps 23 has a diameter of 3 to 10 μm and a height of 3 to 50 μm.

The second semiconductor chip 20 which is held above the first semiconductor chip 10 by using a tool 40 is opposed to the first semiconductor chip 10 with the back surface thereof facing downward.

As a member for providing electrical connection, there may be used a conductive paste, an anisotropic conductive resin, a metal filler dispersed resin, or the like instead of the metal bumps 23. It is also possible to form the metal bumps not on the second internal electrodes 21 of the second semiconductor chip 20 but on the first internal electrodes 11 of the first semiconductor chip 10.

Next, in the step shown in FIG. 11B, the second semiconductor chip 20 is mounted on the first semiconductor chip 10 by the same procedure as shown in FIG. 10B. Then, the internal electrodes 11 and 12 of the first and second semiconductor chips 10 and 20 are bonded to each other and the resin 30 is cured, whereby the bonded structure 51 composed of the second semiconductor chip 20 mounted on the first semiconductor chip 10 is formed.

Figure 11C:
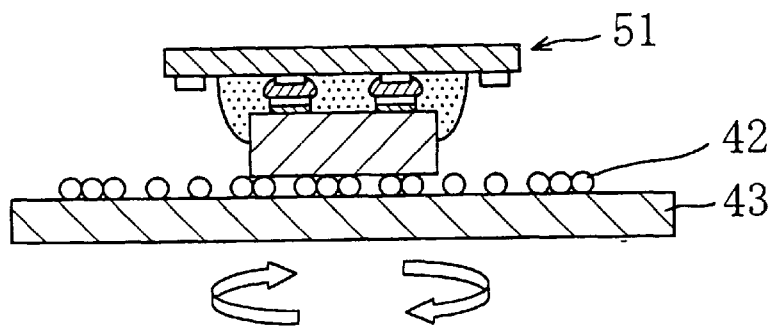
Figure 11D:
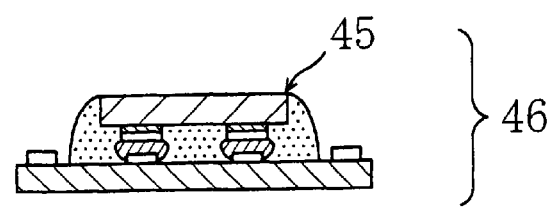
Figure 11E:
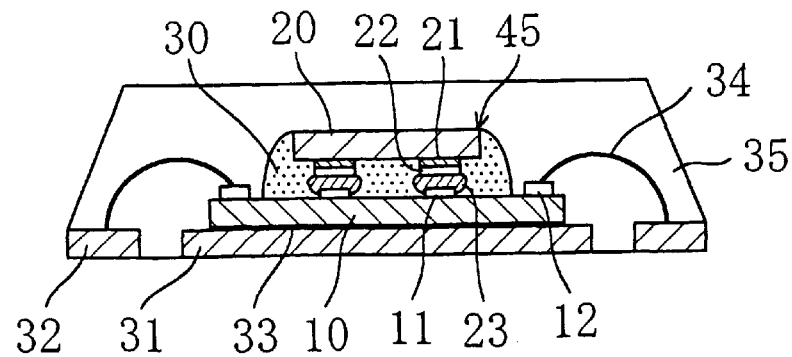

Next, in the steps shown in FIGS. 11C to 11E, the step of polishing the back surface of the second semiconductor chip 20 of the bounded structure 51, the wire bonding step, the packaging step, and the like are performed by the same procedure as used in the steps shown in FIGS. 10D to 10F.

Since the present variation individually polishes, in the step shown in FIG. 11C, the back surface of the second semiconductor chip 20 of each of the bounded structures 51 each composed of the first and second semiconductor chips 10 and 20 bonded to each other, abrasive grains 42 are supplied more smoothly to the corners 45 of the back surface of the second semiconductor chip 20 so that easier polishing is performed than in the method according to the fifth embodiment.

Variation 2 of Embodiment 5

A description will be given herein below to a method for fabricating a semiconductor device according to a second variation of the fifth embodiment. In the present variation, the three-dimensional device according to the second variation of the second embodiment will be formed. FIGS. 12A to 12F are cross-sectional views illustrating the process steps for fabricating the semiconductor device in the second variation of the fifth embodiment.

The procedure of forming the three-dimensional device in the present variation is basically the same as the process steps shown in FIGS. 10A to 10F of the fifth embodiment.

Figure 12A:
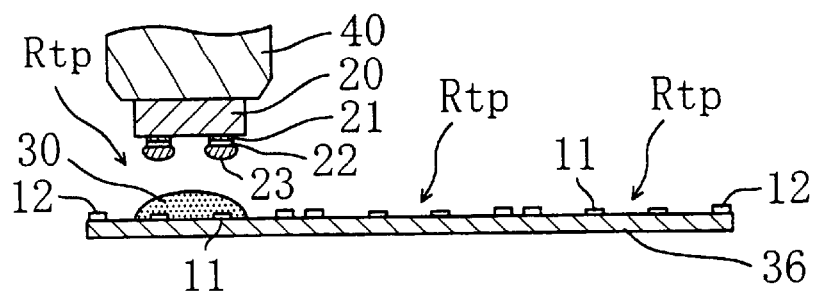
FIGS. 12A to 12F are cross-sectional views illustrating the process steps for fabricating a semiconductor device in a second variation of the fifth embodiment.
Figure 12B:
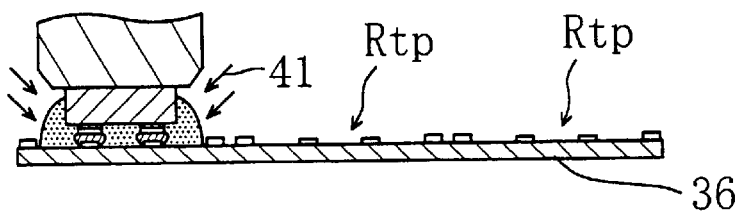
Figure 12C:
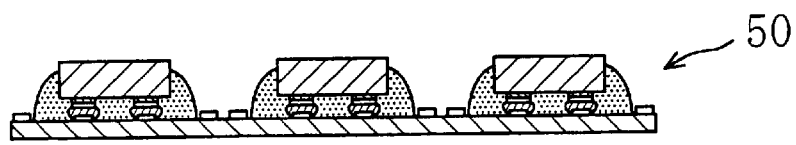
Figure 12D:
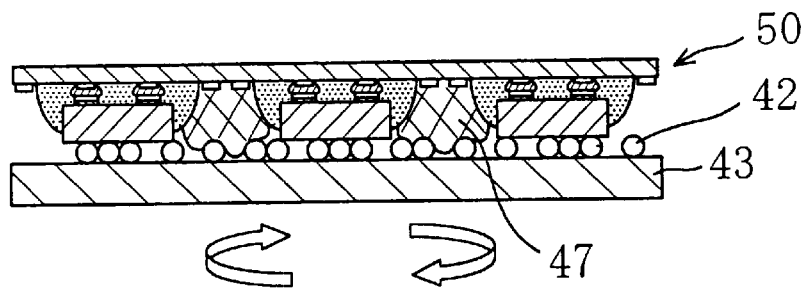
Figure 12E:
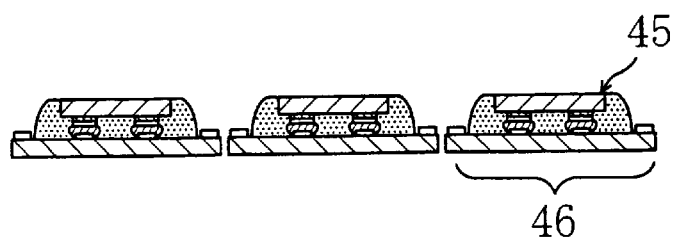
Figure 12F:
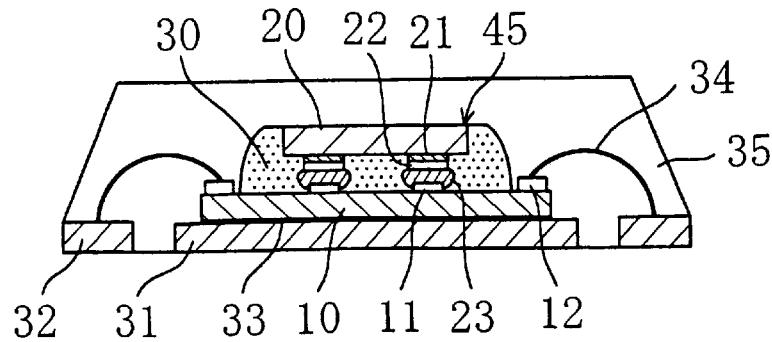

In the present variation, the upper ends of the portions of the resin 30 located on the side surfaces of the second semiconductor chip 20 are exposed in the step shown in FIG. 12D and then the second semiconductor chip 20 and the resin 30 are further polished. The polishing method allows the formation of the three-dimensional device in which the back surface of the semiconductor chip 20 and the upper ends of the resin 30 form a substantially common plane 45.

The present variation enables easier polishing compared with the method according to the fifth embodiment by individually polishing the back surface of the second semiconductor chip 20 of each of the bonded structures 50 each composed of the first and second semiconductor chips 10 and 20 in the step shown in FIG. 12(c).

Variation 3 of Embodiment 5

A description will be given herein below to a method for fabricating a semiconductor device according to a third variation of the fifth embodiment. The present variation will also describe a method for fabricating the semiconductor device according to the second variation of the second embodiment. FIGS. 13A to 13E are cross-sectional views illustrating the process steps for fabricating the semiconductor device in the third variation of the fifth embodiment. In the present variation, the second semiconductor chip 20 is bonded to the first semiconductor chip 10 that has been formed preliminarily by dicing a wafer.

Figure 13A:
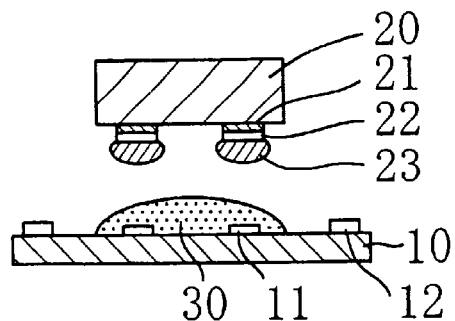
FIGS. 13A to 13E are cross-sectional views illustrating the process steps for fabricating a semiconductor device in a third variation of the fifth embodiment.

In the step shown in FIG. 13A, the second semiconductor chip 20 is aligned with respect to the first semiconductor chip 10. At this time, the same conditions as described with reference to FIG. 10A are used appropriately except for the following. The resin 30 may be composed of a thermosetting resin or a cold setting resin instead of epoxy. The material of the resin 30 may be an acrylic resin, a polyimide resin, an urethane resin, or the like. The resin is applied by a dispensing, printing, stamping, or like method. A proper method is selected based on a chip size and the like. The application of the resin is not limited to the wafer 36 on which the first semiconductor chip 10 is disposed. It is also possible to apply the resin to the second semiconductor chip 20 instead.

Figure 13B:
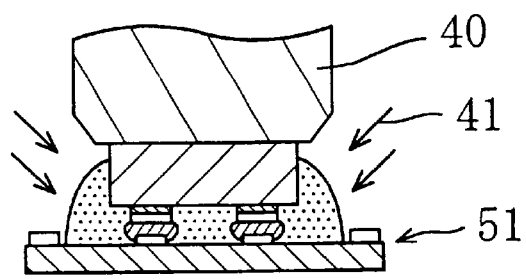

The timing of applying the resin 30 is not necessarily before the alignment shown in FIG. 13A and may also be after the alignment and the bonding of the internal electrodes 11 and 12 via the metal bumps 23 (in the step shown in FIG. 13B).

As the material of the metal bumps 23 formed above the second semiconductor chip 20, any one of Au, In, In—Sn, Sn—Ag, Sn—Cu, Sn—Zn, Cu, and Ni can be used selectively. Each of the metal bumps 23 has a diameter of 3 to 10 $\mu$m and a height of 3 to 50 $\mu$m.

The second semiconductor chip 20 which is held above the first semiconductor chip 10 by using a tool 40 is opposed to the first semiconductor chip 10 with the back surface thereof facing downward.

As a member for providing electrical connection, there may be used a conductive paste, an anisotropic conductive resin, a metal filler dispersed resin, or the like instead of the metal bumps 23. It is also possible to form the metal bumps not on the second internal electrodes 21 of the second semiconductor chip 20 but on the first internal electrodes 11 of the first semiconductor chip 10.

Next, in the step shown in FIG. 13B, the second semiconductor chip 20 is mounted on the first semiconductor chip 10 by the same procedure as shown in FIG. 10B. Then, the internal electrodes 11 and 12 of the first and second semiconductor chips 10 and 20 are bonded to each other and the resin 30 is cured, whereby the bonded structure 51 composed of the second semiconductor chip 20 mounted on the first semiconductor chip 10 is formed.

Figure 13C:
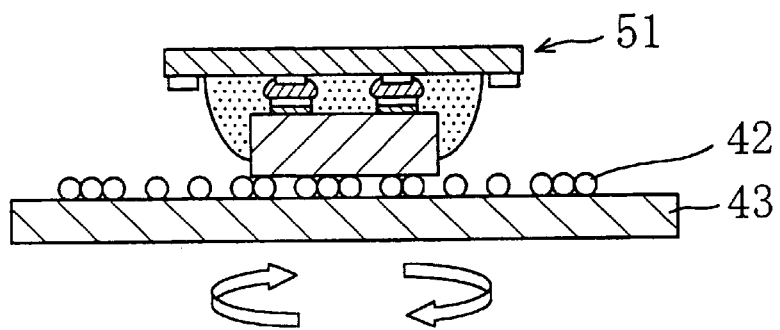
Figure 13D:
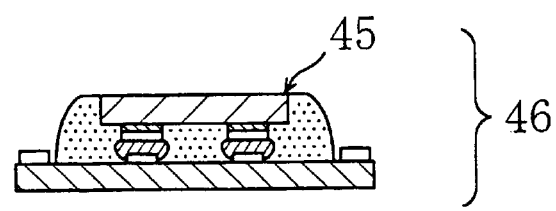
Figure 13E:
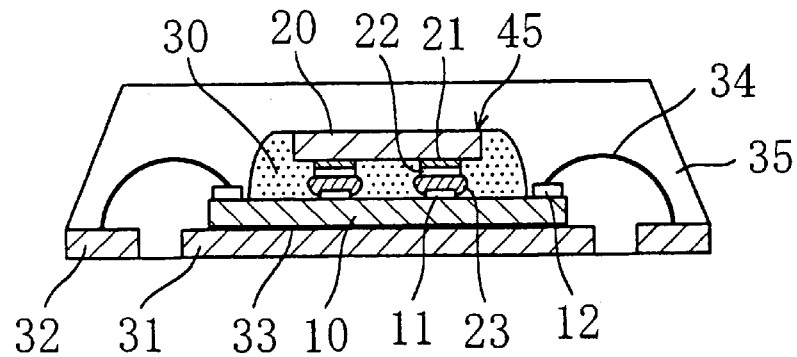

Next, in the steps shown in FIGS. 13C to 13E, the step of polishing the back surface of the second semiconductor chip 20 of the bounded structure 51, the wire bonding step, the packaging step, and the like are performed by the same procedure as used in the steps shown in FIGS. 10D to 10F.

Since the present variation individually polishes, in the step shown in FIG. 13C, the back surface of the second semiconductor chip 20 of each of the bounded structures 51 each composed of the first and second semiconductor chips 10 and 20 bonded to each other, abrasive grains 42 are supplied more smoothly to the corners 45 of the back surface of the second semiconductor chip 20 so that easier polishing is performed than in the method according to the second variation.

Embodiment 6

A description will be given herein below to a method for fabricating a semiconductor device according to a sixth embodiment of the present invention. The sixth embodiment will describe a method for fabricating the semiconductor device according to the third embodiment described above. FIGS. 14A to 14F are cross-sectional views illustrating the process steps for fabricating the semiconductor device in the present embodiment.

Figure 14A:
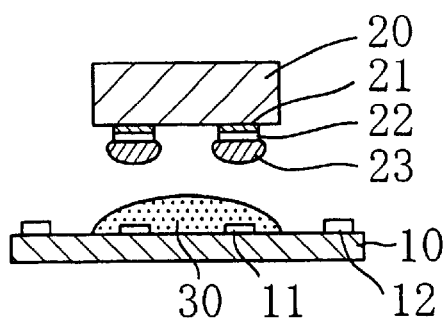
FIGS. 14E to 14E are cross-sectional views illustrating the process steps for fabricating a semiconductor device in a sixth embodiment of the present invention.

In the step shown in FIG. 14A, the second semiconductor chip 20 is aligned with respect to the first semiconductor chip 10 by the following procedure. First, a wafer having a large number of chip formation regions formed with semiconductor elements and wiring is prepared. By cutting the wafer into the individual chip formation regions by dicing, the first semiconductor chip 10 is formed. A plurality of internal electrodes 11 composed of aluminum and a plurality of bonding pads 12 composed of aluminum are provided on the upper surface of the first semiconductor chip 10. The first semiconductor chip 10 is placed on a mounting jig (not shown) and a resin 30 composed of epoxy or the like is applied to an upper surface of the first semiconductor chip 10. The resin 30 may be composed of a thermosetting resin or a cold setting resin instead of epoxy. The material of the resin 30 may be an acrylic resin, a polyimide resin, an urethane resin, or the like. The resin is applied by a dispensing, printing, stamping, or like method. A proper method is selected based on a chip size and the like. The application of the resin is not limited to the first semiconductor chip 10. It is also possible to apply the resin to the second semiconductor chip 20 instead.

Figure 14B:
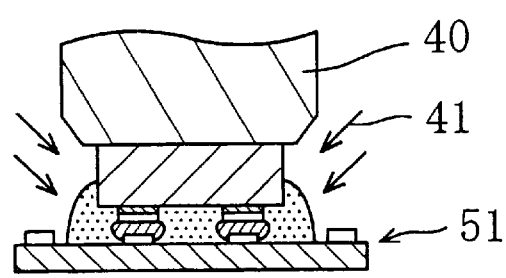
Figure 14C:
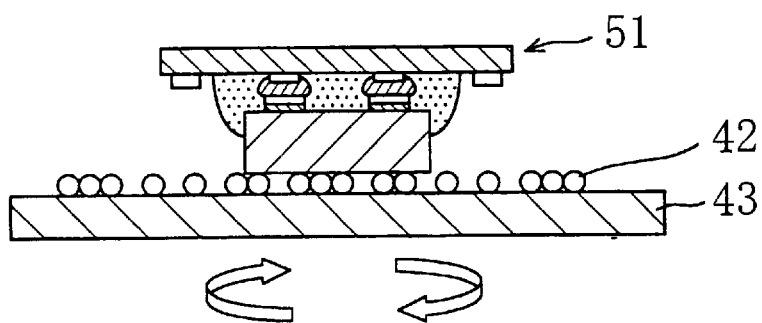

The timing of applying the resin 30 is not necessarily before the alignment shown in FIG. 14A and may also be after the alignment and the bonding of the internal electrodes 11 and 12 via the metal bumps 23 (in the step shown in FIG. 14B)

In the present embodiment, the resin 30 should be applied in an amount sufficient to form a fillet made of the resin on the side surface of the second semiconductor chip 20, though it differs depending on conditions determined by the types of the semiconductor chips, especially the area of the second semiconductor chip 20 and the like. Specifically, the resin 30 is preferably applied in an amount such that the height or width of the fillet of the cured resin 30 is about 15 to 300 $\mu$m or more (see FIG. 15).

Meanwhile, the second semiconductor chip 20 having the plurality of second internal electrodes 21 composed of aluminum and disposed on the principal surface thereof and barrier metal layers 22 over the second internal electrodes 21 is prepared and the metal bumps 23 are formed on the barrier metal layers 22 of the second semiconductor chip 20. Each of the barrier metal layers 22 is composed of a Ti/Cu/Ni metal thin film, while each of the metal bumps 23 is composed of Sn—Pb. As the material of the metal bumps 23, any one of Au, In, In—Sn, Sn—Ag, Sn—Cu, Sn—Zn, Cu, and Ni can be used selectively. Each of the metal bumps 23 has a diameter of 3 to 10 $\mu$m and a height of 3 to 50 $\mu$m.

The second semiconductor chip 20 which is held above the first semiconductor chip 10 by using a tool 40 is opposed to the first semiconductor chip 10 with the back surface thereof facing downward.

As a member for providing electrical connection, there may be used a conductive paste, an anisotropic conductive resin, a metal filler dispersed resin, or the like instead of the metal bumps 23. It is also possible to form the metal bumps not on the second internal electrodes 21 of the second semiconductor chip 20 but on the first internal electrodes 11 of the first semiconductor chip 10.

Next, in the step shown in FIG. 14B, the first semiconductor chip 10 and the second semiconductor chips 20 are bonded to each other by the following procedure.

First, the second semiconductor chip 20 which is held by the tool 40 is lowered in level such that the metal bumps 23 formed on the second internal electrodes 21 of the second semiconductor chip 20 are aligned with respect to the first internal electrodes 11 disposed on the first semiconductor chip 10. The first internal electrodes 11 on the first semiconductor chip 10 and the metal bumps 23 of the second semiconductor chip 20 that have been aligned are heated and pressed to be bonded by using a physical or metallurgical effect (such as the effect of alloying due to atomic interdiffusion). In the case of applying the resin 30 before bonding (in the step shown in FIG. 10A), the resin 30 is spread under pressure between the first semiconductor chip 10 and the second semiconductor chip 20. At this time, the viscosity of the resin 30 further increases the provisional securing force between the first semiconductor chip 10 and the second semiconductor chip 20. As for the pressing force applied by the tool 40, a load of 0.1 to 20 g on each of the metal bumps 23 is appropriate. The magnitude of the load is determined under the constraint that it does not damage the first internal electrodes 11 on the first semiconductor chip 10 nor change the respective characteristics of the semiconductor element such as a transistor and the wiring formed under the first internal electrodes 1. Thereafter, the second semiconductor chip 20 and the first semiconductor chip 10 are integrated by curing the resin 30. For the integration, the resin 30 is irradiated with UV light 41 if it is photo-setting or the resin 30 is heated if it is thermosetting. If the resin 30 is cured by heating, heating is performed by using a heating tool such as an oven after the pressure applied by the tool 40 is removed or direct heating is performed by using a heater provided in the tool 40 or the like under the pressure. To cure the thermosetting resin 30, a temperature of 70 to 300° C. is required, though it differs depending on the material of the resin 30.

By the foregoing process steps, the bonded structure 51 composed of the second semiconductor chip 20 mounted on the first semiconductor chip 10 is obtained. As a replacement for the resin 30 to be filled between the semiconductor chips and the wafer, an ACF (Anisotropic Conductor Film) or ACP (Anisotropic Conductor Paste) may also be used.

Figure 14D:
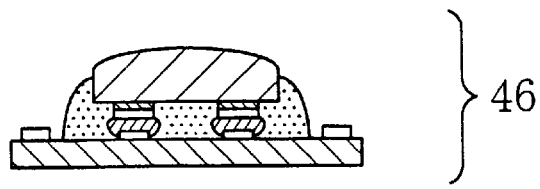

Next, in the step shown in FIG. 14D, the back surface of the second semiconductor chip 20 in the bonded structure 50 is polished. After the resin 30 is cured satisfactorily in the step shown in FIG. 14C, the bonded structure 51 is placed on a polisher 43 with the back surface (surface facing upward) of the second semiconductor chip 20 mounted on the first semiconductor chip 10 opposed to the upper surface of the polisher 43. The back surface of the second semiconductor chip 20 is then polished by supplying abrasive grains 42 to a polishing surface of the polisher 43 and rotating the polisher 43 while applying a load on the bonded structure 50. As the abrasive grains 42, diamond grains each having a grain size of about #1200 to #2000 are preferably used. Preferably, the polisher 43 has a number of revolutions of about 5 to 50 rpm.

As shown in FIG. 15, the present variation performs polishing by rotating the bonded structure 51 and the polisher 43, while changing an angle $\theta 2$ at which the bonded structure 51 is tilted with respect to a normal to the polishing surface of the polisher 43. This allows the corners 45 of the back surface of the second semiconductor chip 20 to be rounded up in a wider range after the completion of the polishing step and provides a semiconductor device 46 in which the center portion of the second semiconductor chip 20 is thicker than the peripheral portion thereof.

Figure 14E:
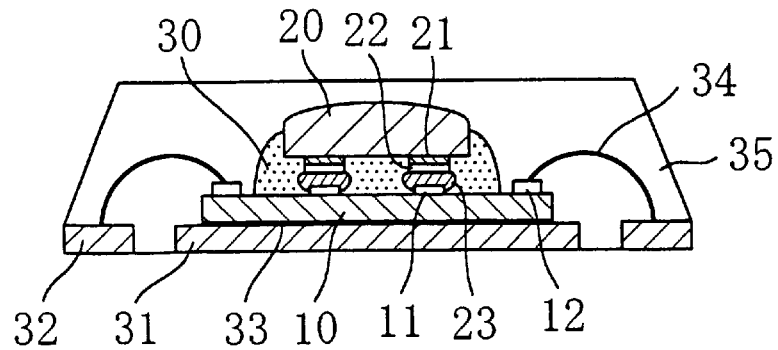

Next, in the step shown in FIG 14E, the semiconductor device 46 is packaged. First, the semiconductor device 46 is mounted on the die pad 31 of the lead frame and secured thereto by using the conductive paste 33 containing Pd, Ag, or the like. Then, the bonding pads 12 of the first semiconductor chip 10 and the leads 32 of the lead frame are connected to each other with bonding wires 34 having a diameter of 25 $\mu$m ø and composed of Au, Al, or the like. Finally, the first semiconductor chip 10, the second semiconductor chip 20, the bonding wires 34, the die pad 31 of the lead frame, and part of the leads 32 of the lead frame are sealed with the epoxy- or polyimide-based sealing resin 35.

By the foregoing process steps, the three-dimensional device according to the third embodiment which is composed of the second semiconductor chip 20 mounted on and integrated with the first semiconductor chip 10 is formed easily.

Figure 16:
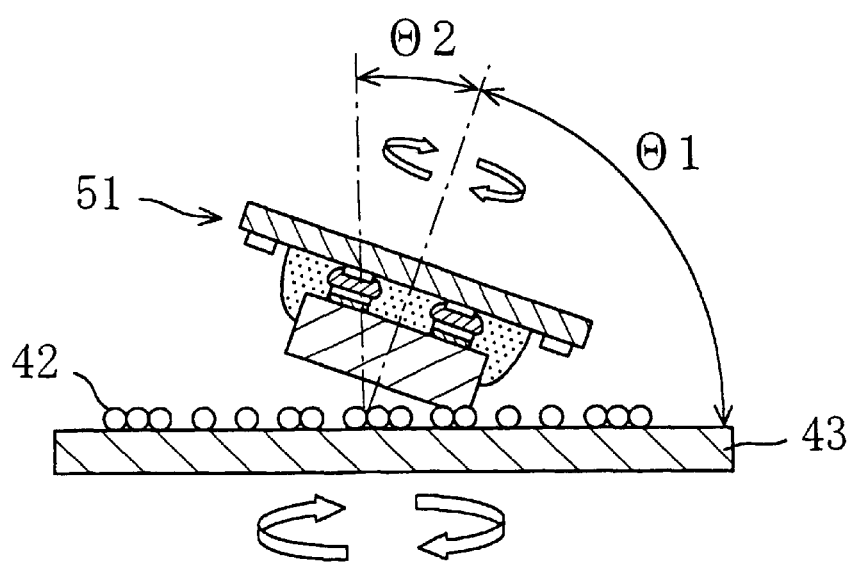
FIG. 16 is a cross-sectional view illustrating a method for polishing the back surface of the second semiconductor chip in the sixth embodiment.
Figure 17:
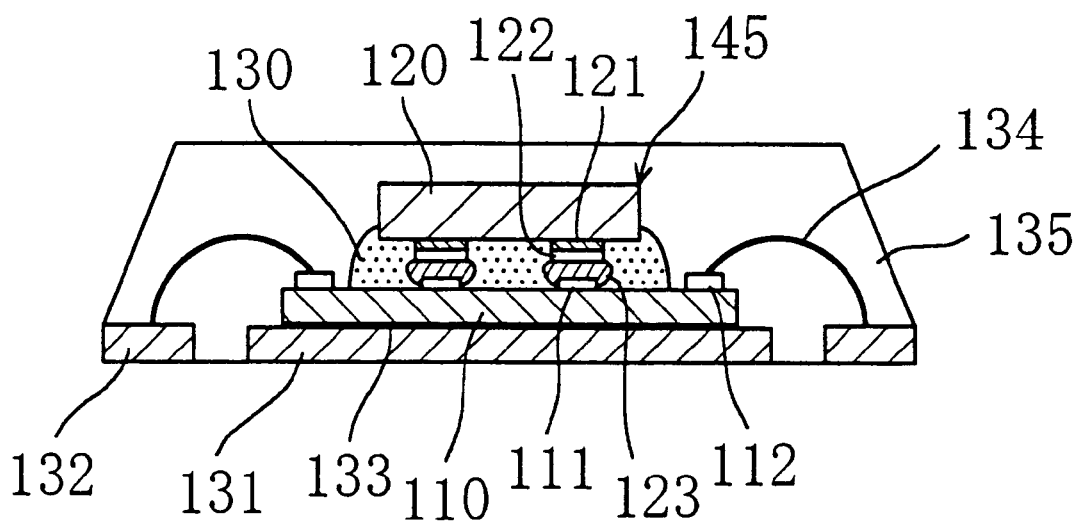
FIG. 17 is a cross-sectional view showing a structure of a conventional three-dimensional device.
Figure 18A:
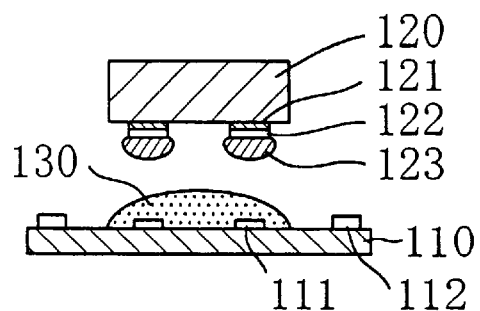
FIGS 18A to 18D are cross-sectional views illustrating the process steps for fabricating the conventional three-dimensional device.
Figure 18B:
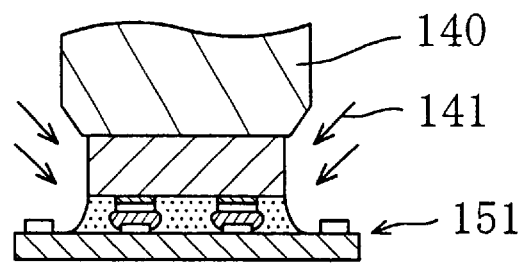
Figure 18C:
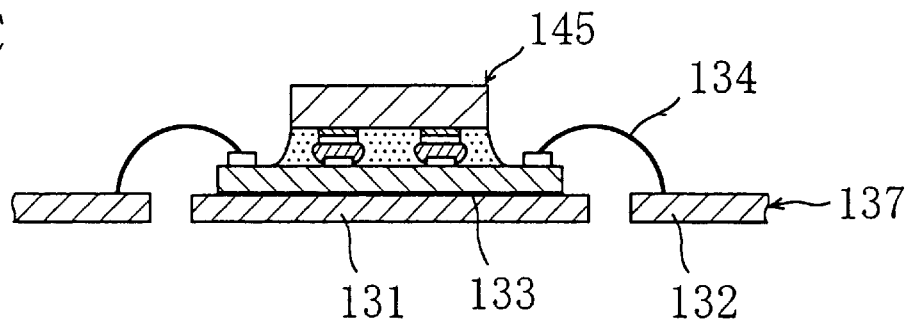
Figure 18D:
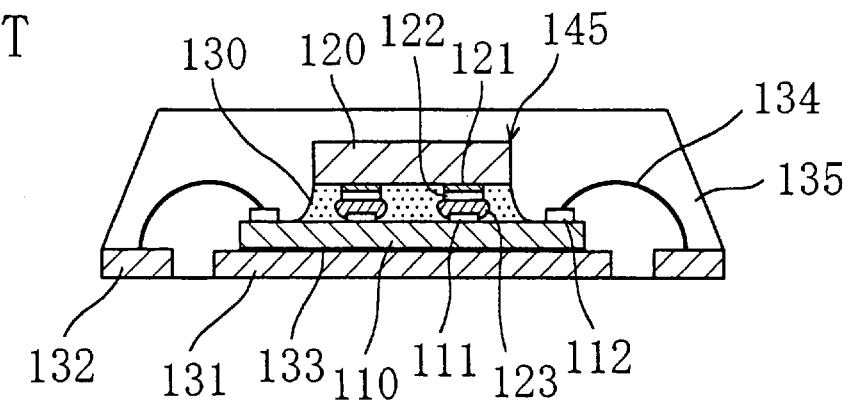

If grinding is performed in the state shown in FIG. 16 by using a grinder having a sand grindstone instead of the polisher 43, while holding a constant angle θ2 at which the bonded structure 51 is tilted with respect to the normal to the surface of the sand grindstone, the structure shown in the variation of the first embodiment shown in FIG. 2 can be obtained easily.

In each of the fourth to sixth embodiments, the first resin 37 to be interposed between the first and second semiconductor chips 10 and 20 and the second resin 38 for covering the side surfaces of the second semiconductor chip 20 may also be applied and cured individually, as shown in FIG. 4 or 6.

Although each of the embodiments has regarded the surfaces provided with the first and second internal electrodes 11 and 21 as the respective principal surfaces of the first and second semiconductor chips 10 and 20, the present invention is not limited to such embodiments. Therefore, the present invention is also applicable to the first semiconductor chip 10 or the second semiconductor chip 20 having internal electrodes on the back surface thereof via a conductor film provided in a through hole of the semiconductor chip or on a side surface thereof.

What is claimed is:

1. A method for fabricating a semiconductor device comprising a first semiconductor chip and a second semiconductor chip mounted on the first semiconductor chip with respective electrodes of the first and second semiconductor chips being electrically connected to each other, the method comprising the steps of:

preparing a wafer including first semiconductor chip formation regions each having a first electrode disposed on an upper surface thereof to form the first semiconductor chip and a second semiconductor chip having a second electrode disposed on an upper surface thereof;

mounting the second semiconductor chip on each of the chip formation regions of the wafer and providing electrical connection between the first and second electrodes; forming a resin layer between each of the chip formation regions of the wafer and the second semiconductor chip;

polishing a lower surface of the second semiconductor chip with the second semiconductor chip being mounted on the wafer;

separating the wafer into the individual chip formation regions and individually forming bonded structures each composed of the second semiconductor chip mounted on the first semiconductor chip; and sealing the second semiconductor chip on the first semiconductor chip with a sealing resin.

2. The method of claim 1, wherein the step of providing the electrical connection between the first and second electrodes includes the step of:

forming a bump on at least one of the first and second electrodes and connecting the first and second electrodes via the bump.

3. A method for fabricating an semiconductor device comprising a first semiconductor chip and a second semiconductor chip mounted on the first semiconductor chip with respective electrodes of the first and second semiconductor chips being electrically connected to each other, the method comprising the steps of;

preparing a first semiconductor chip having a first electrode disposed on an upper surface thereof and a second semiconductor chip having a second electrode disposed on an upper surface thereof;

mounting the second semiconductor chip on a region to be formed with the first semiconductor chip and providing electrical connection between the first and second semiconductor electrodes;

forming a resin layer between the first and second semiconductor chips;

polishing a lower surface of the second semiconductor chip with the second semiconductor chip being mounted on the first semiconductor chip; and sealing the first and second semiconductor chips with a sealing resin.

4. The method of claim 3, wherein the step of providing the electrical connection between the first and second electrodes includes the step of:

forming a bump on at least one of the first and second electrodes and connecting the first and second electrodes via the bump.

* * * * *